(12) United States Patent  
Dalrymple et al.

(10) Patent No.: US 8,766,665 B2  
(45) Date of Patent: *Jul. 1, 2014

(54) RECONFIGURABLE LOGIC AUTOMATA

(75) Inventors: David Allen Dalrymple, Columbia, MD (US); Erik Demaine, Cambridge, MA (US); Neil Gershenfeld, Somerville, MA (US); Forrest Green, Cambridge, MA (US); Ara Knaian, Newton, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 33 days.

This patent is subject to a terminal disclaimer.

(21) Appl. No.: 13/226,484

(22) Filed: Sep. 6, 2011

(65) Prior Publication Data

US 2012/0062277 A1    Mar. 15, 2012

Related U.S. Application Data

(63) Continuation of application No. 12/561,262, filed on Sep. 16, 2009, now Pat. No. 8,013,629, and a continuation-in-part of application No. 12/422,979, filed on Apr. 13, 2009, now Pat. No. 8,035,414, which is a continuation-in-part of application No. 12/422,491, filed on Apr. 13, 2009.

(60) Provisional application No. 61/192,178, filed on Sep. 16, 2008, provisional application No. 61/123,809, filed on Apr. 11, 2008, provisional application No. 61/123,985, filed on Apr. 11, 2008.

(51) Int. Cl.
*H03K 19/173* (2006.01)
*H03K 19/177* (2006.01)

(52) U.S. Cl.
USPC ............................................. 326/38; 326/39

(58) Field of Classification Search
USPC ............................................. 326/37–41, 47
See application file for complete search history.

(56) References Cited

U.S. PATENT DOCUMENTS 4,700,187 A * 10/1987 Furtek .............................. 326/39

* cited by examiner

*Primary Examiner* — Jany Richardson
(74) *Attorney, Agent, or Firm* — Norma E. Henderson

(57) ABSTRACT

A family of reconfigurable asynchronous logic elements that interact with their nearest neighbors permits reconfigurable implementation of circuits that are asynchronous at the bit level. A reconfigurable asynchronous logic cell comprises a set of one-bit buffers for communication with at least one neighboring cell, each buffer capable of having several states and configured for receiving input state tokens from neighboring cells and for transferring output state tokens to neighboring cells, and a one-bit processor configured to perform a logic operation utilizing received tokens as inputs and to produce an output token reflecting the result of the logic operation, wherein the logic operation and the functional configuration of the buffers are reconfigurably programmable. A reconfigurable logic circuit comprises a plurality of reconfigurable logic cells that compute by locally passing state tokens and are reconfigured by the directed shifting of programming instructions through neighboring logic cells.

12 Claims, 16 Drawing Sheets

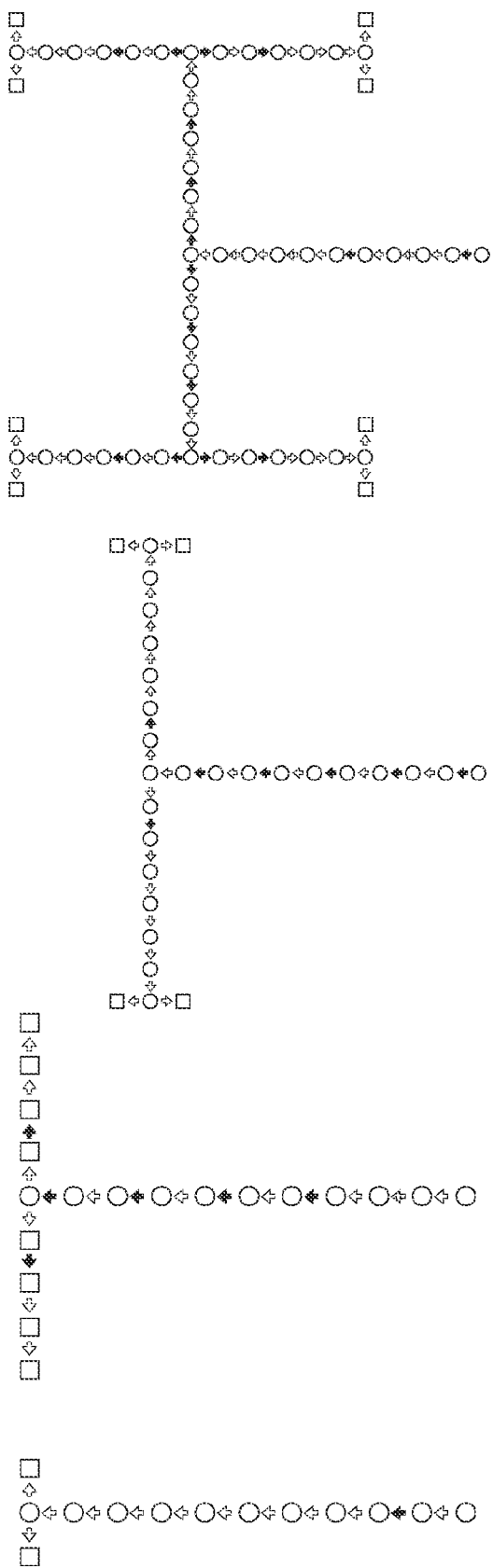

RECONFIGURABLE LOGIC AUTOMATA

RELATED APPLICATIONS

This application is a continuation of U.S. patent application Ser. No. 12/561,262, filed Sep. 16, 2009, which claims the benefit of U.S. Provisional Application Ser. No. 61/192,178, filed Sep. 16, 2008, the entire disclosures of which are herein incorporated by reference.

This application is also a continuation-in-part of U.S. patent application Ser. No. 12/422,979, filed Apr. 13, 2009, which claims the benefit of U.S. Provisional Application Ser. No. 61/123,809, filed Apr. 11, 2008, and U.S. patent application Ser. No. 12/422,491, filed Apr. 13, 2009, which claims the benefit of U.S. Provisional Application Ser. No. 61/123,985, filed Apr. 11, 2008, the entire disclosures of which are each herein incorporated by reference.

STATEMENT REGARDING FEDERALLY SPONSORED RESEARCH OR DEVELOPMENT

This invention was made with U.S. government support under Grant Number H94003-07-2-0707, awarded by the Naval Research Lab, and Grant Number W911NF-08-1-0254, awarded by the Army Research Office. The government has certain rights in this invention.

FIELD OF THE TECHNOLOGY

The present invention relates to logic circuits, cellular automata, and computation models and, in particular, to reconfigurable asynchronous logic automata.

BACKGROUND

Today's most advanced computers are used to model physical systems, such as, for example, the folding of a protein or the circulation of the global climate, but they are also physical systems themselves. The demands of high-performance computing have driven the frontiers of device physics from vacuum tubes to semiconductor heterostructures. Between these simulated and physical realities lie many layers of abstraction: materials are assembled into devices, devices into circuits, circuits into boards, boards into cases, cases into racks, and racks into systems, and, in corresponding layers of software, applications are implemented in algorithms, written in a high-level language, compiled into microcode, scheduled by an operating system, and then executed by processors.

Most computer science programming models hide the underlying physical reality of computation, and the corresponding layers of software serve to insulate programs and programmers from knowledge of the physical construction of the computer. This division of labor is now being challenged by the growing complexity of computing systems. While device performance has been improving exponentially for decades and has a firm future roadmap [Paul S. Peercy, "The Drive to Miniaturization", Nature (406), pp. 1023-26 (2000)], this has not been true for software. Rather, cost overruns, shipping delays, and bugs have been recurring features of development efforts ranging from taping out chips to delivering operating systems. Along with programmer productivity, system scaling obstacles include interconnect bottlenecks and prohibitive power requirements.

As information technologies scale down in device size and up in system complexity, their computational and physical descriptions converge as the number of information-bearing degrees of freedom becomes comparable to the number of physical ones. It is already possible to store data in atomic nuclei and to use electron bonds as logical gates [N. Gershenfeld and I. Chuang, "Bulk Spin Resonance Quantum Computation", Science (275), pp. 350-356 (1997)]. In such a computer, the information-bearing degrees of freedom are the same as the physical ones, and it is no longer feasible to account for them independently. The universe executes in linear time, independent of its size. A scalable computer architecture must similarly reflect the scaling of its contents. An explicit description of the spatial distribution, propagation, and interaction of information in a computer program offers portability across device technologies (which must satisfy the same physical laws), scalability across machine sizes (because physical dynamics are inherently parallel), and simplification of fabrication (since causality implies locality).

The performance of a computer is limited by the bandwidth and latency of the connection between where data is stored and where it is processed. Early computers were far more limited by speed and availability of processing and memory than the performance of the connections between them. Von Neumann or Harvard-style computer architectures, where for each cycle data is transmitted to and manipulated in a central processing unit, are well suited for computers built from slow and expensive processing elements (i.e. vacuum tubes) and comparatively fast and cheap communication (wires). However, faster modern building blocks (smaller transistors, improved logic families, and other emerging technologies) have outpaced the rate that data can be fetched from memory. The operating speeds of many modern computers are beyond even the relativistic limits for data to be retrieved from an arbitrary location in a single cycle. In modern computers, it can take hundreds or even thousands of cycles to fetch a piece of data. There are a wide variety of techniques that have been developed to anticipate what data will be needed and load it ahead of time (pipelining, caching, instruction reordering, branch prediction, speculative execution, etc.), but the availability and behavior of these features can vary widely from processor to processor as can their effectiveness with different program behaviors. Although the Von Neumann abstraction is a familiar model of computation, in order to write software that takes advantage of the aggressive performance possible with modern (and future) technologies, fundamentally different models of computation will be needed, as well as computer architectures that can efficiently run them.

Physics, above the atomic level, is inherently local, and computation, like every other process, relies on physics. Thus, programming models that assume non-local processes, such as data buses, random access memory, and global clocking, must be implemented at a slow enough speed to allow local interactions to simulate the non-local effects that are assumed. Since such models do not take physical locality into account, even local effects are limited to the speed of the false non-local effects, by a global clock that regulates all operations.

A second physical attribute of information is causality: there is a finite propagation velocity. The length of the wires in a computer introduces a distance and hence time scale to its operation. This is manifestly violated in the Parallel Random Access Machine (PRAM) model for parallel computing [R. M. Karp, M. Luby, F. Meyer auf der Heide, "Efficient PRAM Simulation on a Distributed Memory Machine", Algorithmica (16), pp. 517-542 (1996)], which assumes instantaneous access from any processor to any memory location. If instead the only interconnect is between neighboring cells, then the information velocity is on the order of the gate propagation delay over the gate size, which can be picoseconds per micron [M. Sokolich, A. R. Kramer, Y. K. Boegeman, and R. R. Martinez, "Demonstration of Sub-5 ps CML Ring Oscillator Gate Delay with Reduced Parasitic AlInAs/InGaAs HBT", IEEE Electron Device Letters (22), pp. 309-311 (2001)]. This is about 100 times slower than the speed of light, or nanoseconds to cross millimeter distances on a chip, which is comparable to the speed at which conventional chips are clocked. In return for using nearest-neighbor communication the interconnect becomes a programmable part of the computation rather than fixed wiring, and scaling is based on the cell size rather than the chip size.

In computing today, many observers agree that there is a practical physical speed limit for the venerable von Neumann model (see, e.g., Ronny Ronen, Avi Mendelson, Konrad Lai, Shih L. Lu, Fred Pollack, and John P. Shen, "Corning challenges in microarchitecture and architecture", Proceedings of the IEEE, 89(3):325-340, 2001), and that the bulk of future speed increases will derive from parallelism in some form. Chipmakers are currently working to pack as many processors as they can into one box to achieve this parallelism, but in doing so, they are moving even further from the locality that is necessary for a direct implementation as physics. At the other end of the abstraction spectrum, while sequential programming models can be generalized to use multiple parallel threads, such models are often clumsy and do not reflect the physical location of the threads relative to each other or memory.

In addition, research has long suggested that asynchronous (or "self-timed") devices consume less power and dissipate less heat than typical clocked devices [Tony Werner and Venkatesh Akella, "Asynchronous processor survey", Computer, 30(11):67-76, 1997]. However, traditional microarchitectures require significant book-keeping overhead to synchronize various functional blocks, due to the nature of their instructions, which must be executed in sequence. Most asynchronous designs to present have derived their performance benefits from clever pipelining and power distribution rather than true asynchrony—known as "globally asynchronous, locally synchronous" design—and often this is not enough to offset the overhead [D. Geer, "Is it time for clockless chips? [asynchronous processor chips]", Computer, 38(3):18-21, March 2005].

These shortcomings are accepted because of the tremendous body of existing code written in sequential fashion, which is expected to run on the latest hardware. However, by removing the assumption of backwards compatibility, there is an opportunity to create a new, disruptive programming model that is more efficient to physically implement. In particular, such a model could scale favorably to an arbitrary number of parallel elements, to larger problem sizes, and to faster, smaller process technologies. Potentially, this may have eventual impact across the computing industry, particularly in high-performance computing. In addition, it could be an enabling technology for the Singularity (see Ray Kurzweil, "The Singularity Is Near: When Humans Transcend Biology", Viking Adult, September 2005).

Information in physics is an extensive quantity. Like mass, it scales with the system size. For a computer to do the same, it must be uniform, unlike the inhomogeneous combinations of processors, memory, storage, and communications that are the norm today. For this reason, cellular architectures have long been attractive as a model for computation [J. von Neumann, "Theory of Self-Reproducing Automata", edited by A. W. Burks, Univ. of Illinois Press (Urbana, 1966)], and more recently for its implementation [M. Sipper, "The Emergence of Cellular Computing", Computer (32), pp. 18-26 (1999)].

"Cellular Automata" was originally a discrete model in which space, time, and states were discretized, and update rules were carefully designed for studying complex phenomena [Neil Gershenfeld (1999), "The Nature of Mathematical Modeling", Cambridge, UK: Cambridge University Press]. Cellular automata were found to be quite successful in modeling physical interactions governed by differential equations in a continuum limit, such as, for example, lattice gases for hydrodynamics [U.S. Pat. No. 6,760,032; U. Frisch, B. Hasslacher, and Y. Pomeau, "Lattice-Gas Automata for the Navier-Stokes Equation", Phys. Rev. Lett. (56), pp. 1505-1508 (1986)] and spin dynamics [E. Domany and W Kinzel, "Equivalence of Cellular Automata to Ising Models and Directed Percolation", Phys. Rev. Lett. (53), pp. 311-314 (1984)]. Because of this great potential of computing as a physical system, cellular automata present a practical architecture for computation [N. Margolus, "Physics-Like Models of Computation", Physica D (10), pp. 81-95 (1984)].

Relevant research in the 1970s demonstrated that universal Boolean logic could be implemented in cellular automata with one-bit states and just three local rules [R. E. Banks, "Information Processing and Transmission in Cellular Automata", Ph.D. thesis, MIT (1971)]. The Banks Boolean cellular automata has only three rules, acting in 2D on one-bit states with 4 rectangular neighbors. The simplicity in primitive functioning unit, however, led to complexity in the implementation of wires and gates. In such a system, the logic functions are distributed, requiring many cells to realize them. The generality of a cellular automata's rule table allows many other behaviors to be modeled, such as hydrodynamics or graphics. Many more variants of cellular automata models/applications [see, e.g., U.S. Pat. No. 6,910,057] and hardware implementations [see, e.g., U.S. Pat. No. 7,509,479; U.S. Pat. No. 5,243,238] have been proposed. All of these implementations are based on Boolean logic.

If the goal is just computation, then this can be implemented more compactly in "logic automata" in which every cell can contain a logic gate and store its state, locally providing the interactions needed for computational universality. Logic automata are a subset of cellular automata [N. Gershenfeld, The Nature of Mathematical Modeling, Cambridge University Press, 1999] and quantize space and time with distributed cells connected locally, each performing a basic logic operation. Logic automata are therefore scalable, universal for digital computation [R. E. Banks, Information Processing and Transmission in Cellular Automata, Ph.D. thesis, Massachusetts Institute of Technology, 1971], and reflect the nature of many complex physical and biological systems [D. A. Dalrymple, N. Gershenfeld, and K. Chen, "Asynchronous logic automata," Proceedings of AUTOMATA 2008 (14th International Workshop on Cellular Automata), pp. 313-322, June 2008; L. O. Chua, "CA belongs to CNN," invited talk at AUTOMATA 2008 (14th International Workshop on Cellular Automata), June 2008]. Logic automata form a family of computer architectures that expose a cartoon version of physics that is easy for a programmer to work with but maintains the underlying physical relationship between the size of logic elements, their computation rates, and signal travel speeds. This allows programmers to work with abstractions that will have well defined behavior for both correctness and performance, regardless of which underlying technology is used to fabricate it.

The history begins with the cellular automata of von Neumann [John von Neumann, "Theory of Self-Reproducing Automata", University of Illinois Press, 1966], designed to explore the theory of self-replicating machines in a mathematical way (though never finished). This was some time after he completed the architecture for the EDVAC project [John von Neumann, "First Draft of a Report on the EDVAC", IEEE Annals of the History of Computing, 15(4):27-75, 1993], which has come to be known as "the von Neumann architecture." Many papers since then can be found examining (mostly 2-state) cellular automata, and there are a few directions to prove simple cellular automata universality—Alvy Ray Smith's [Alvay Ray Smith, "Cellular Automata Theory", PhD thesis, Stanford University, 1970], E. Roger Banks' [Edwin Roger Banks, "Cellular Automata", Technical Report AIM-198, MIT, June 1970], and Matthew Cook's more recent Rule110 construction [Matthew Cook, "Universality in elementary cellular automata", Complex Systems, 15(1), 2004]. However, while interesting from the point of view of computability theory, classical cellular automata clearly over-constrain algorithms to beyond the point of practicality, except in a small class of problems related to physical simulation (for instance, see Uriel Frisch, Dominique d'Humieres, Brasl Hasslacher, Pierre Lallemand, Yves Pomeau, and Jean-Pierre Rivet, "Lattice gas hydrodynamics in two and three dimensions", pages 77-135, Addison-Wesley, 1990).

An earlier model of cellular automaton was known as the "Logic CA" [unpublished]. The Logic CA has ties to previous work [e.g., John von Neumann, "Theory of Self-Reproducing Automata", University of Illinois Press, 1966], particularly if familiar with these types of constructions. A typical cellular automaton is an indefinite lattice (usually 2-dimensional) of "cells", each of which has a state variable that takes one of a finite number of values at every discrete time step (0, 1, 2, ... ), and a transition function which takes as arguments the states of a cell's nearest neighbors and itself at some time step, and returns the state of that cell in the next time step. The number of neighbors is typically 4 or 8 in 2-dimensional cellular automaton, depending on the inclusion of diagonal neighbors.

The Logic CA consists of cells with 8 neighbors and 9 bits of state. The state bits are divided into 8 configuration bits and 1 dynamic state bit. The configuration bits are further divided into 2 gate bits that choose among the four allowed Boolean functions (AND, OR, XOR, NAND) and 6 input bits that choose among the 36 possible pairs of (potentially identical) inputs chosen from the 8 neighbors ($\frac{1}{2} \cdot 8 \cdot (8-1)+8$). At each time step, a cell examines the dynamic state bit of its selected inputs, performs the selected Boolean operation on these inputs, and sets its own dynamic state to the result.

Mathematically, an instance of the Logic CA can be described as a series of global states $S_t$ ($t \in \mathbb{N}0$), each composed of local states $s_{t(i,j)} \in \{0, 1\}$ ($i, j \in \mathbb{Z}$), and a set of constant configuration elements $$c_{(i,j)} \in C = (\{AND, OR, XOR, NAND\} \times (\{-1, 0, 1\}^2 - \{(0, 0)\})^2)$$
$$= \{AND, OR, XOR, NAND\} \times$$
$$\{(1, 0), (1, 1), (0, 1), (-1, 1),$$
$$(-1, 0), (-1, -1), (0, -1), (1, -1)\} \times$$
$$\{(1, 0), (1, 1), (0, 1), (-1, 1),$$
$$(-1, 0), (-1, -1), (0, -1), (1, -1)\}$$

(note that there is a bijection between C and $\{0, 1\}^8$, 8 bits) such that $$s_{t+1,i,j} = \begin{cases} \text{if } (c_{(i,j)})_1 = AND & s_{t,(i,j)+(c_{(i,j)})_2} \wedge s_{t,(i,j)+(c_{(i,j)})_3} \\ \text{if } (c_{(i,j)})_1 = OR & s_{t,(i,j)+(c_{(i,j)})_2} \vee s_{t,(i,j)+(c_{(i,j)})_3} \\ \text{if } (c_{(i,j)})_1 = XOR & s_{t,(i,j)+(c_{(i,j)})_2} \oplus s_{t,(i,j)+(c_{(i,j)})_3} \\ \text{if } (c_{(i,j)})_1 = NAND & \overline{s_{t,(i,j)+(c_{(i,j)})_2} \wedge s_{t,(i,j)+(c_{(i,j)})_3}} \end{cases}$$

Although the Logic CA is useful for many applications, two major problems were identified with it: lack of reversible/adiabatic logic and the requirement for a global clock. The system does not employ conservative logic [Edward Fredkin and Tommaso Toffoli, "Conservative logic", International Journal of Theoretical Physics, 21(3):219-253, April 1982] or adiabatic computing [J. S. Denker, "A review of adiabatic computing", In Low Power Electronics, Digest of Technical Papers, IEEE Symposium, pages 94-97, 1994], which is necessary to truly represent physical resources. The clock is global, which is clearly a non-local effect, and cellular automata are not fundamentally required to have a global clock in order to perform universal computation [Kenichi Morita and Katsunobu Imai, "Logical Universality and Self-Reproduction in Reversible Cellular Automata", ICES '96: Proceedings of the First International Conference on Evolvable Systems, pages 152-166, London, UK, 1996, Springer-Verlag; Jia Lee, Ferdinand Peper, Susumu Adachi, Kenichi Morita, and Shinro Mashiko, "Reversible Computation in Asynchronous Cellular Automata", UMC '02: Proceedings of the Third International Conference on Unconventional Models of Computation, pages 220-229, London, UK, 2002, Springer-Verlag].

Another related sub-field is that of field-programmable gate arrays (FPGAs). Gate arrays have evolved over time from sum-product networks such as Shoup's [R. G. Shoup, "Programmable Cellular Logic Arrays", PhD thesis, Carnegie Mellon University, 1970] and other acyclic, memoryless structures such as Minnick's [R. C. Minnick, "Cutpoint Cellular Logic", IEEE Transactions on Electronic Computers, EC13(6):685-698, December 1964] to the complex, non-local constructions of today's commercial offerings, yet skipping over synchronous and sequential, but simplified local-effect cells.

The tradition of parallel programming languages, from Occam [A. W. Roscoe and C. A. R. Hoare, "The laws of Occam programming", Theoretical Computer Science, 60(2):177-229, September 1988] to Erlang [Joe Armstrong, Robert Virding, Claes Wikstrom, and Mike Williams, "Concurrent Programming in Erlang", Second Edition, Prentice-Hall, 1996] to Fortress [Guy L. Steele, Eric Allen, David Chase, Victor Luchangco, Jan-Willem Maessen, Sukyoung Ryu, and Sam Tobin-Hochstadt, "The Fortress Language Specification", Technical report, Sun Microsystems, March 2007] is also of interest. Although they are designed for clusters of standard machines (possibly with multiple processors sharing access to a single, separate memory), they introduce work distribution techniques and programming language ideas that are likely to prove useful in the practical application of the present invention.

The Connection Machine [W. Daniel Hillis, "The Connection Machine", MIT Press, Cambridge, Mass., 1985] was designed with a similar motivation—merging processing and memory into a homogeneous substrate—but as the name indicates, it also included many non-local connections ("In an abstract sense, the Connection Machine is a universal cellular automaton with an additional mechanism added for non-local communication. In other words, the Connection Machine hardware hides the details.") However, the implementation of Lisp on the Connection Machine [G. L. Steele and W. D. Hillis, "Connection Machine Lisp: fine-grained parallel symbolic processing", ACM Press, 1986] does introduces concepts such as xectors, which are likely to be useful in the implementation of functional programming languages in a cellular automaton-based architecture.

SUMMARY

A family of reconfigurable, asynchronous logic elements that interact with their nearest neighbors allows the design and implementation of circuits which are asynchronous at the bit level, rather than merely at the level of functional blocks. These elements pass information by means of charge packets (tokens), rather than voltages. Each cell is self-timed, and cells that are configured as interconnect perform at propagation delay speeds, so hardware non-local connections are not needed. Reconfigurable asynchronous logic automata are a specialized extension of asynchronous logic automata, specifically designed to provide virtual and physical reconfigurability.

In one aspect, a reconfigurable asynchronous logic element is a cell having a set of edges with neighboring cells, each containing zero or one tokens, thus comprising a bit of state. Each cell represents one logical operation, storage for its state, one unit of space, and one unit of time to transit. At each time step, a cell examines the dynamic state bit of its selected inputs, performs the selected Boolean operation on these inputs, and sets its own dynamic state to the result. Logical states are represented by tokens for 0 and 1, and gates pull and push tokens when their inputs are valid and outputs empty. Between each pair of cells, in each direction, there is a pair of edges, one to represent a "0" signal, and the other a "1" signal. Instead of each cell being configured to read the appropriate inputs, this data is now represented by an "active" bit in each edge. Then, each cell becomes a stateless node (except the gate type), which can fire on the conditions that all its active inputs are providing either a "0" token or a "1" token and that none of its active output edges is currently occupied by a token of either type. When firing, it consumes the input tokens, removing them from the input edges, performs its configured function, and deposits the result to the appropriate output edges.

In one aspect of the invention, a reconfigurable asynchronous logic element comprises a set of edges for communication with at least one neighboring cell, each edge having an input for receiving tokens from neighboring cells and an output for transferring tokens to at least one neighboring cell, circuitry configured to perform a logic operation utilizing received tokens as inputs and to produce an output token reflecting the result of the logic operation, and circuitry. In another aspect, a reconfigurable lattice of asynchronous logic automata comprises a plurality of reconfigurable logic automata that compute by locally passing state tokens and are reconfigured by the directed shifting of programming instructions through neighboring logic elements.

BRIEF DESCRIPTION OF THE DRAWINGS

Other aspects, advantages and novel features of the invention will become more apparent from the following detailed description of the invention when considered in conjunction with the accompanying drawings wherein:

FIGS. 7A-D depict an example of building an H-tree fractal using parallel construction, according to one aspect of the present invention;

DETAILED DESCRIPTION

Reconfigurable logic automata are, in a preferred embodiment, a specialized extension of asynchronous logic automata, and are specifically designed to provide virtual and physical reconfigurability. Asynchronous logic automata are a family of reconfigurable, charge-conserving asynchronous logic elements that interact with their nearest neighbors, facilitating the design and implementation of circuits which are asynchronous at the bit level, rather than merely at the level of functional blocks (sometimes known as "globally asynchronous, locally synchronous" design). These circuits pass information by means of charge packets (tokens), rather than voltages, thus conserving energy. Because each cell is self-timed, cells that are configured as interconnect perform at propagation delay speeds, so hardware non-local connections are not needed.

Logic automata in general are a class of cellular automata specialized for computation, in which the cells are logic gates.

Their development is aimed at aligning the computational and physical descriptions of information processing systems in order to provide scalability, incremental extensibility, and flexibility in two- and three-dimensional form factors. Asynchronous logic automata eliminate the need for synchronized operation by using tokens to represent the logical states; when a cell has valid inputs and empty outputs it pulls the input tokens and pushes the output tokens. This eliminates the need for clock distribution, and allows for faster and lower-power operation. Asynchronous logic automata can be understood as an asymptotic limit of FPGAs and multicore processors, in which each cell represents one unit of time, space, state, and logic. Because asynchronous logic automata have only nearest-neighbor interconnect, global programs must be loaded through local communications in a regular array. Reconfigurable asynchronous logic automata (RALA) accomplish this through the use of "stem" cells that can be dynamically configured as any cell type, and that can transfer communication strings.

A computer in the RALA model of computation consists of cells arranged in the cubic lattice (or the square lattice in 2D), with two wires connecting cells that are a unit distance apart (adjacent in x, y, or z). Each cell has a small amount of state defining its behavior as a "one-bit CPU", and this state is reprogrammable. For example, one cell might repeatedly take a bit from its north neighbor, take a bit from its south neighbor, and output their XOR to its west and east neighbors, effectively forming an XOR stream processor with two inputs and two copies of the output. Later, a neighboring cell might reprogram this cell to perform AND computations instead of XOR. The heart of the RALA model is this reprogramming functionality, enabled by a particular type of cell called a stem cell.

Figure 1:
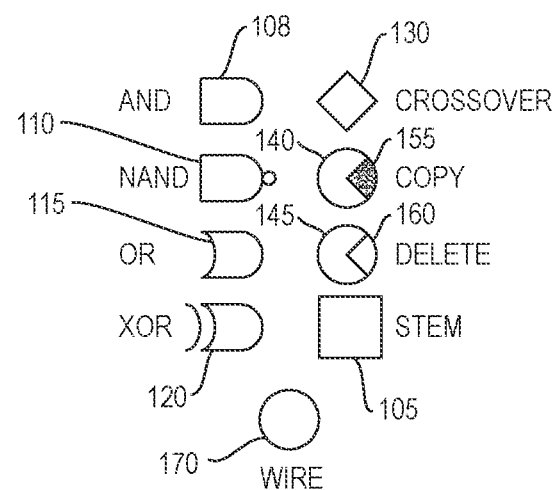
FIG. 1 is a chart functionally depicting Asynchronous Logic Automata cell types, according to one aspect of the present invention.

FIG. 1 is a chart functionally depicting asynchronous logic automata cell types, according to one aspect of the present invention. When implemented using reconfigurable logic automata, these types are essentially modes that define the cell's currently configured behavior. "Stem" cells 105 provide the option of reconfigurability. There are also 4 logic cell types: AND 108, NAND 110, OR 115, and XOR 120. NAND 110 is actually universal, with the others being included in order to simplify logic design. Transport (crossover) cell 130 provides non-blocking token transport. Copy 140 and delete 145 cells have a data input, marked by a triangle 155, 160, and a control input; when the control is 0, the data token passes the gate, and when it is 1, the data token is either deleted or copied. Copy and delete cells either pass or create and destroy input tokens based on the value of the control token. Each of these two-input gates is deterministic, so that their operation is independent of the evaluation order in an Asynchronous Logic Automata circuit. They are connected by wire cells 170 between nearest neighbors (rectangular in 2D or 3D) that can store a token or be empty. In some embodiments, one input AND 108 or OR 115 gates are utilized as wire cells 170.

Reconfigurable Asynchronous Logic Automata according to the present invention are based on the earlier model cellular automaton known as the Logic CA, but they solve the two identified major problems with it, lack of reversible/adiabatic logic and the requirement for a global clock. In the majority of cases, these asynchronous circuits consume less total power, dissipate proportionally less waste heat, and run more quickly than synchronous equivalents. They may solve any problems that can be solved with a computer, but scale far more readily due to their local-only connections, and will find practical applications in high-performance and/or scientific computing. They may also be considered as replacements for field-programmable gate array devices, having the same advantages in power, heat, and speed. Asynchronous Logic Automata according to the present invention are described in more detail in U.S. patent application Ser. No. 12/422,979, filed Apr. 13, 2009, of which this application is a continuation-in-part and which is incorporated by reference herein in its entirety.

Figure 2:
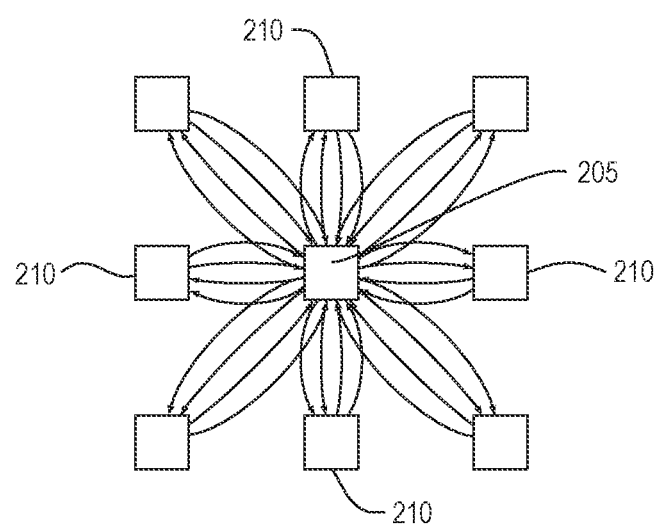
FIG. 2 depicts an exemplary conceptual embodiment of a basic Asynchronous Logic Automata cell.

FIG. 2 depicts an exemplary conceptual embodiment of a basic Asynchronous Logic Automata cell 205 and its neighbors 210, according to one aspect of the present invention. Logical states are represented by tokens for 0 and 1, and gates pull and push tokens when their inputs are valid and outputs empty. Between each pair of cells, in each direction, there is a pair of edges, one to represent a "0" signal, and the other a "1" signal. Each pair of edges could be considered one edge which can carry a "0" token or a "1" token. Instead of each cell being configured to read the appropriate inputs, this data is now represented by an "active" bit in each edge. Then, each cell becomes a stateless node (except the gate type), which can fire on the conditions that all its active inputs are providing either a "0" token or a "1" token and that none of its active output edges is currently occupied by a token of either type. When firing, it consumes the input tokens, removing them from the input edges, performs its configured function, and deposits the result to the appropriate output edges. As it is a marked graph, the behavior of this model is well-defined, even without any assumptions regarding the timing of the computations, except that each computation will fire in some finite length of time after the preconditions are met.

While the reconfigurable logic automata of the present invention may be advantageously implemented as digital Asynchronous Logic Automata, and the preferred embodiments discussed herein are directed to such an implementation, it will be clear to one of skill in the art that they may also be advantageously implemented as Analog Logic Automata. Analog Logic Automata are described in detail in co-pending U.S. patent application Ser. No. 12/422,491, "Analog Logic Automata", filed Apr. 13, 2009, the entire disclosure of which is herein incorporated by reference.

Reconfigurable Asynchronous Logic Automata pass data only locally, as in systolic arrays. RALA does not rely on global synchronization, making use of token presence or absence to ensure data validity, as do Petri nets. It is programmed by spreading instructions through the same local wires as data, in a way reminiscent of von Neumann's Universal Constructor. It consists of simple, custom one-bit processors, similar to the (original) Connection Machine. It has native support for standard logical primitives (AND, OR, XOR, and NAND), as well as data flow in any direction, like FPGAs. Instructions are passed locally and processed as if they are data. Thus, not only can self-replicating systems be built, but also systems that branch into multiple directions, and follow a logical program of mutations as they get further from the seed. RALA permits easy and efficient construction of useful primitives such as arithmetic operations on arbitrary word sizes, and even matrix/vector operations.

In general, a cell has one of eight modes defining its current behavior (FIG. 1), up to two input directions among the six neighboring wires, and up to six output directions. It is convenient to distinguish the two inputs (when there are two) as first and second, while the outputs are unordered. Each mode defines a different behavior of how the cell reads inputs and writes outputs, but the communication is always through the wires. Two wires connect every pair of adjacent cells, one in each direction. A wire has one of three states: 0, 1, and empty. Effectively, a wire is a one-bit buffer for data, with the empty state indicating that the data is not yet available. Cells wait for their inputs to be available (nonempty) before proceeding with computation, thus providing a local synchronization mechanism that avoids the need for global clocking. The synchronization is actually very simple because each wire has a single writer (the source) and single reader (the target). In implementation, a wire can be built as part of the target cell (or the source cell).

The simpler computational elements include the trivial special case of a cell programmed to have no inputs. Such a cell is a no-op, never consuming inputs and never producing outputs, independent of its mode. No-op cells are useful as filler, and may later be reprogrammed. The most intuitive cell modes are the logical operations: AND, OR, XOR, NAND. In one of these modes, a cell waits for a bit to be available on both of its input wires (or one if the cell has only one input) and for all of its output wires to be empty. When both the inputs and outputs are ready, the cell computes the logical function on the input bits, writes the resulting bit to all of the output wires, and empties the input wires. A slightly more sophisticated implementation waits only for the inputs to become available, and stores the output of the logical function in an internal register (and empties the input wires) while waiting for the outputs to become empty. Experiments with both implementations and have found it to make little difference in circuit design, although the more sophisticated implementation is slightly easier to work with.

A useful special case is when a logical cell has only one input; then it effectively acts as a wire with a possible output splitter. Such cells are represented graphically as circles, because the specific logic gate is irrelevant in this case. Another intuitive cell mode is the crossover, which is most useful when building 2D RALA circuits. A cell in this mode must have two inputs that form a right angle at the cell, and the two other wires in that plane must be outputs. This type of cell is the only one that does not wait for both inputs to become available. Rather, it waits for any one input/output pair to become ready (input available and output empty); then it copies the input bit to the output wire and empties the input wire.

Two more unusual cell modes are the so-called memory operations: copy and delete. This mode distinguishes the first and second inputs as control and data. As with logical operations, the cell waits for all inputs and outputs to become ready. Then, if the control bit is 0, it copies the data input to the outputs and empties both input wires. The more interesting behavior is when the control bit is 1. In this case, a copy cell copies the data input to the outputs but then empties only the control wire, leaving the bit on the data input wire; while a delete cell empties both input wires without writing anything to the output wires. Copy cells enable making arbitrarily many copies of a bit in a stream, while delete cells enable filtering bits out of a stream. Without these operations, the total number of bits in the system would be conserved (ignoring stem cells for the moment), which makes it difficult if not impossible to do certain computations. Though less symmetric, it is practical to allow a delete cell to operate when the output wires are not ready, provided the control bit is a 1. This variation does not appear to affect circuit design.

The stem cell is the most complicated and interesting feature of the RALA model. Its purpose is to enable reprogramming the entire state of cells: their mode, input directions, output directions, and input wire values. Effectively, a stem cell enables the transformation of data (streams of 0s and 1s) into programs (cell state). To achieve these goals, stem cells actually offer two functions: they can transform a neighboring cell into a stem cell and start forwarding messages to it, and they can reprogram their own state (typically changing to a mode other than stem cell). The idea is that a stem cell can first create a chain of stem cells that fill the necessary space, use their forwarding capacity to route messages to the cells in order, and then program each one in order to build a circuit.

More precisely, a stem cell has a single input, from which it receives a stream of bits encoded according to the stem protocol. From the perspective of this stem cell, the protocol consists of a series of forwarding rounds. Each round begins with a three-bit code, given in Table 1, to indicate the (relative) direction to forward messages, or the special code 000 to indicate the end of forwarding and the beginning of programming the current stem cell. If the code is not special, the stem cell transforms the cell in the specified direction into a "child" stem cell, and forwards subsequent bits in the protocol to that child. The forwarding round ends when the child stem cell is fully programmed (implemented by that stem cell sending a message back to its parent). Then the bit stream may specify another direction to transform into a stem cell and forward messages, and so on, until the special code 000.

Table 1 presents an exemplary set of options for the three-bit code for encoding direction relative to the input direction.

TABLE 1

| code | direction |
| --- | --- |
| 000 | special (end of forwarding/program this cell/no input) |
| 001 | continue straight (opposite the input direction) |
| 010 | turn left (in same xy plane as input direction) |
| 011 | turn right (in same xy plane as input direction) |
| 100 | go up (absolute + z) |
| 101 | go down (absolute − z) |
| 110 | unused |
| 111 | unused |

After the special code 000, the protocol specifies the entire state of the cell to replace the present stem cell, as follows:
1 the mode, using the three-bit code in Table 2;
2 the first input direction, using the three-bit code in Table 1, where the special code 000 indicates "no first input";
3 the second input direction, using the three-bit code in Table 1, where the special code 000 indicates "no second input"; and
4 the output directions, using a six-bit code indicating whether each direction (in the order of Table 1) is an output(1) or not(0).
Once the stem cell receives this fifteen-bit code, it notifies its parent stem cell that it is fully programmed (finishing its round of forwarding), and begins acting in the specified mode with specified inputs and outputs.

Table 2 presents an exemplary set of options for the three-bit code for encoding the mode of a cell.

TABLE 3

| code | mode |
| --- | --- |
| 000 | AND cell |
| 001 | NAND cell |
| 010 | OR cell |
| 011 | XOR cell |
| 100 | crossover cell |
| 101 | copy cell |
| 110 | delete cell |
| 111 | stem cell |

Figure 3C:
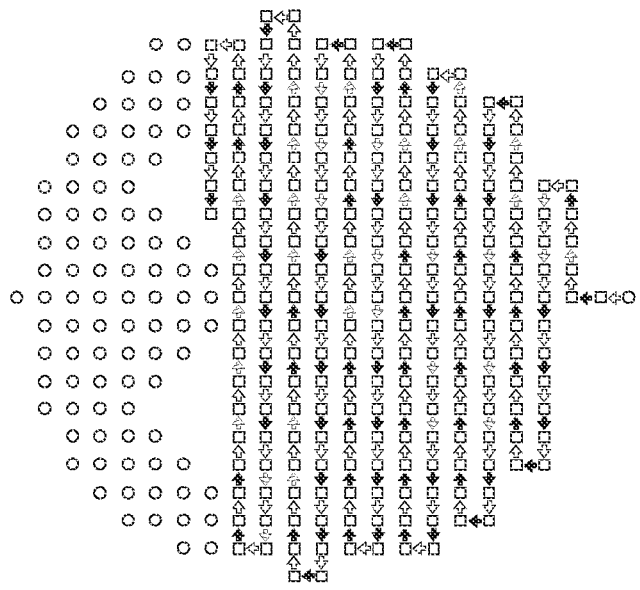
FIGS. 3A-C depict an example of construction of a RALA circuit by building a forwarding chain and then programming the cells, according to one aspect of the present invention.
Figure 3A:
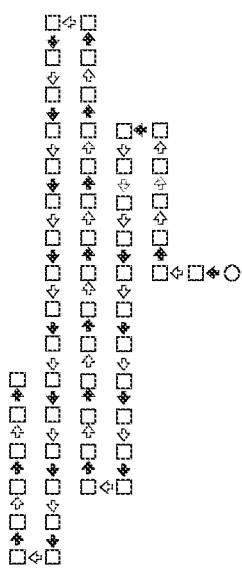
Figure 3B:
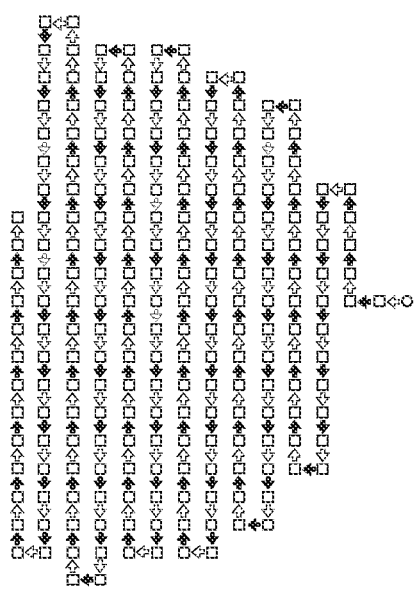

An advantage of the RALA model is its construction universality: any RALA circuit can be encoded into a bit string with the property that, when fed into a single stem cell, produces the desired circuit. One simple construction is for the code to use the forwarding mechanism to build a chain of stem cells that cover the desired circuit (and possibly some extra cells), and then program those cells one by one from the end to have the desired modes and initial input-wire states (and program any extra cells visited by the chain of stem cells into no-ops). FIGS. 3A-C depict an example of construction of a RALA circuit by building a forwarding chain and then programming the cells. FIG. 3A depicts the initial building of the forwarding chain, FIG. 3B, depicts further building of the forwarding chain, and FIG. 3C depicts a completed forwarding chain with initial programming of cells. This implementation uses the bounding-box scan-line algorithm, optimized to go only as far as necessary in each scan line.

The length of the encoding and resulting construction time is proportional to the length of the chain covering the circuit. Perhaps the simplest chain that covers a desired circuit is a scan-line tour of the bounding box, visiting each 1D row in order within each 2D slab in order within the box. The length of this string is proportional to the volume of the bounding box. For circuits that densely occupy their bounding box, this approach is a reasonable one, but in general it is suboptimal.

With a bit of care, a chain can be constructed that covers a desired circuit using at most eight times as many cells as are used by the circuit. The idea is to view the RALA cells as being grouped into 222 blocks on a twice coarsened grid. Then the chain visits all eight cells in every block that contains at least one cell used by the circuit. The set of all cells contained in these blocks (whose number is at most eight times the number of cells used by the circuit) is Hamiltonian: each cell can be visited exactly once by a closed tour, by repeatedly gluing together closed tours of each block. This assumes that the groups form a connected set; this property is implied by the circuit consisting of a connected set of cells.

With even more care, exactly the desired circuit can be constructed, programming exactly the desired cells and no additional no-ops. This example assumes that the circuit consists of a connected set of cells. This construction is useful when there are other circuits nearby that it is desirable not to overwrite, and it also achieves a time bound proportional to the number of cells used by the circuit. The basic idea is to follow a dual spanning tree of the used cells, that is, a minimal set of connections between cells that form a connected structure (a tree). The tree is rooted at one of the cells, which will be the original stem cell from which the circuit will be created (typically chosen to be on the boundary of the bounding box of the circuit). For each cell in the tree, the encoding creates each child of the cell (via a forward instruction), recursively builds the child's subtree, stops forwarding one step (via code 000), and then proceeds to the next child (if any). Although such a construction is conceptually more complicated because some cells do multiple forwarding tasks, the end result is quite attractive. In particular, the length of the code and the construction time are proportional to the number of cells contained in the circuit.

Figures 4A, 4B, 4C, 4D, 4E:
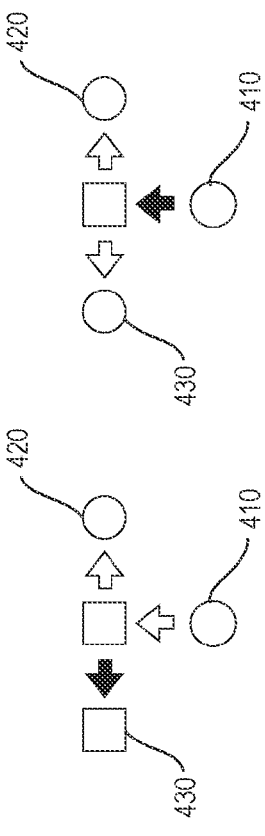
FIGS. 4A-E depict a simple example of construction of a RALA circuit via the spanning-tree algorithm, according to one aspect of the present invention.

FIGS. 4A-E depict a simple example of construction of a RALA circuit via the spanning-tree algorithm. FIG. 4A depicts the initial configuration: one stem cell 410. FIG. 4B depicts forwarding to new stem cell 420 to build the right subtree. In FIG. 4C, the right subtree is completed. FIG. 4D depicts forwarding to new stem cell 430 to build the left subtree. In FIG. 4E, the left subtree is completed.

One important note in these constructions is that the partially built circuit may run, but it will wait (as necessary) for the parts that have not yet been built, and will not interfere with the construction process. The key property is that stem cells accept inputs only from one direction, from which its program code comes, and it provides outputs only to other stem cells. Thus, when a partially built circuit will block when requesting an input from or trying to send an output to an unbuilt part of the circuit, i.e., a stem cell.

Stem cells initially interpret the configuration string as relative folding directions, generating new cells at the end of the path and passing string tokens within the path. A termination code is then used to differentiate the terminal cell on the path. An example of code used to configure reconfigurable asynchronous logic automata according to the present invention is shown in Table 3.

TABLE 3 direction: straight=00 right=01 left=10 end=11
...
gate: and=000 nand=001 or/wire=010 xor=011
    crossover=100 copy=101 delete=110 stem=111
input 1: forward=00 backward=01 right=10 left=11
    (wrt fold direction)
init 1: 0=00 1=01 x=10 not used=11
input 2: not used=00 +90=01 +180=10 +270=11
    (clockwise)
init 2: 0=00 1=01 x=10 stay connected=11
output directions: forward backward right left:
    0=off 1=on (wrt fold direction)

An example of RALA folding configuration code is shown in Table 4.

TABLE 4 format (right-hand rule coordinate system):
  # fold direction: forward=000 backward=001 right=010 left=011
    up=101 down=110 end=111
  # ...
  # gate: and=000 nand=001 or=010 xor=011
  #      cross=100 copy=101 delete=110 stem=111
  # input 1: forward=000 backward=001 right=010 left=011 up=101
    down=110 not used=111
  # init 1: 0=00 1=01 x=10
  # input 2: forward=000 backward=001 right=010 left=011 up=101
    down=110 not used=111
  # init 2: 0=00 1=01 x=10 stay connected=11
  # output directions: forward backward right left up down: 0=off 1=on
  # ...

Figure 5:
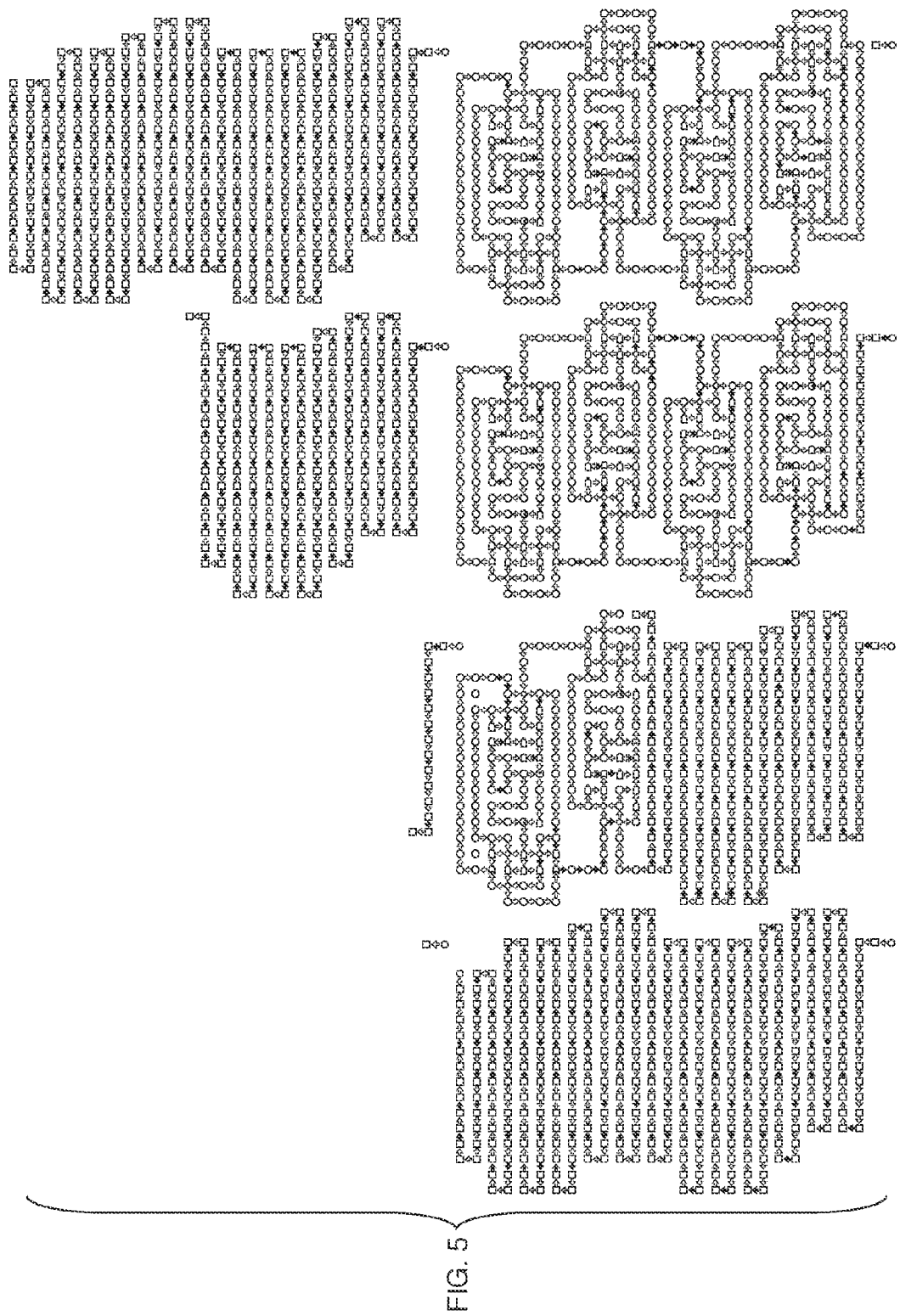
FIG. 5 depicts an example of reconfigurable asynchronous logic automata folding and differentiation of a linear-time sorting circuit, according to one aspect of the present invention.

A differentiated cell becomes active, with the upstream neighbor becoming the new terminal cell. Because the active cells can operate only when they have valid inputs and empty outputs, the global circuit will turn on correctly with only local communication. FIG. 5 depicts an example of reconfigurable asynchronous logic automata folding and differentiation of a linear-time sorting circuit, according to one aspect of the present invention.

Figure 6:
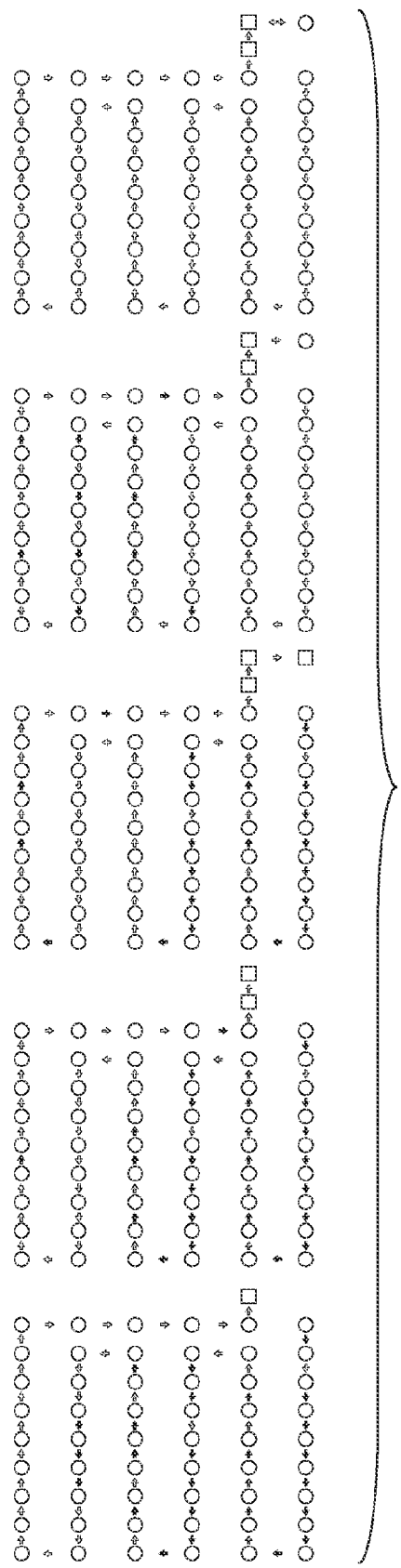
FIG. 6 depicts the exemplary construction of an oscillator through a stem cell, according to one aspect of the present invention.

FIG. 6 depicts the exemplary construction of an oscillator through a stem cell. The initial bit string (stored here in a shift register) creates and folds the new cells, then the subsequent bit string differentiates them. After the last cell in the path is configured it becomes active, waiting for valid asynchronous inputs and outputs, and the preceding call on the path becomes the new terminal one. The global circuit will turn on consistently because each cell will enforce consistency locally.

Similarly, logic, communication, and computation can be integrated in the reconfigurable asynchronous logic automata. Starting from a source cell and a stem cell, a fanout circuit is folded and configured. Then the same bit string from the source causes the new stem cells to fold parallel fanout circuits, and repeating the bit string again causes each of those to create fanout circuits. A folding path is generated for a shape defined by a mathematical string, and the configuration drops the support cells that are no longer needed on the path.

A similar construction applies to creating three-dimensional objects. The combination of coded construction along a folding path and asynchronous operation allows for the loading of arbitrary spatial program structures, I/O to and from arbitrary cells, and eliminates the need for distributed synchronization and clock coordination. It provides an analog to operating system services for such "conformal" computing substrates.

The RALA architecture can be used to write programs that run on standard desktop PCs, emulators on a compute cluster, arrays of commodity microcontrollers, FPGAs, General Purpose Graphics Processing Cards, and implementation in an ASIC. Programs can be compiled into the native instruction set or emulated on virtual machines. Standard techniques, such as on the fly compilation, can be applied to improve performance when emulating the RALA outside of native hardware embodiments. Furthermore a small set of designs for non-reconfigurable versions of the different gates (as either transistor layouts, machine instructions, or similar) can provide a portable and easy to use set of building blocks for designing digital systems with anything from circuits to machine code to microfluidics. These designs would be directly portable from prototyping with reconfigurable gates (more flexibility and faster design iterations) to production runs with fixed gates (at a lower cost).

Possible RALA embodiments include simulation in a compute cluster, virtualization in arrays of commodity microcontrollers, and implementation in an ASIC. The RALA architecture could provide a competitive alternative to technologies like NVIDIA's CUDA and ATI's CTM in the GPGPU (General Purpose computing on Graphics Processing Unit) market. Current technologies are attempting to add flexibility needed for non-graphics tasks to highly specialized stream processors. The RALA architecture provides a clean model of general computation that could be configured for both simple high throughput stream processing or for more general tasks. Prospective RALA applications include program configuration and dynamic rearrangement for high-performance computing, linear-time signal processing, distributed interactive graphics, secure communications, and parallel multi-model inference.

Data and instructions can intermingle in the RALA model: a binary data stream can be transformed into computational elements by way of a stem cell, and to close the loop, computational elements produce data (as usual). In RALA, instructions and data both play by the same rules: locality of transmission, locality of synchronization, etc. This property is not true of many similar types of machines, SIMD being the extreme case. The implication of this property is that all techniques used to process data in interesting and efficient ways can be applied to the instructions as well: instead of programming the system, a program is written to program the system. This fact has implications for the concepts of programming languages and compiler design in the context of RALA.

Many applications resulting from the fusion of computation and reconfiguration can be derived. For clarity of exposition, examples of these are described herein in 2D RALA, but it will be clear to one of skill in the art that they easily generalize to 3D RALA.

H-tree fractal. The simplest idea for mixing computation and reconfiguration is to duplicate a program, using a splitter, to send the same bit stream to two stem cells and thus simultaneously build two copies of the same circuit. To turn this idea into a single program that can be fed into two stem cells, imagine prefixing a program with code to produce a splitter, two stem cells, and wires connecting them. This prefix turns the program for a single circuit into a slightly longer program that makes two identical copies of the circuit. Repeated for more levels, the classic H-tree fractal can be generated, where vertices are splitters and edges are wires.

FIGS. 7A-D depict an example of building an H-tree fractal using parallel construction. FIG. 7A depicts after construction of an initial wire, two stem cells, and a splitter. FIG. 7B depicts construction of the next two wires in parallel. FIG. 7C is after construction of the next four stem cells and splitters, and FIG. 7D depicts after construction of the third level of stem cells and splitters, all in parallel.

The code size and construction time required to fill an n×n square in this way is given by the recurrence $T(n)=T(n\sqrt{2})+\Theta(n)$, which is just $\Theta(n)$, roughly the time necessary simply to traverse the square. By contrast, any code to fill an n×n square with $n^2$ random computational elements requires $\Omega(n^2)$ bits on average. The H-tree fractal is a common tool in planar circuit design because it has a uniform distance from every leaf to the root. Although such layouts are not required in RALA for correctness by clock synchronization, a rough synchronization along these lines can be useful for efficiency of when wire buffers empty.

Grid manufacture. Another example is motivated by bulk manufacture of many identical components. Suppose a b-bit binary string that encodes the assembly (from a single stem cell) of an $x_xy$ module. In the obvious encoding discussed earlier, for example, $b=\Theta(xy)$. Now suppose it is desired to assemble an m×n array of these modules. For example, this motivation arises in building a memory of n words each of m bits, or in building n parallel m-bit adders. In the obvious encoding, this assembly takes $\Theta(mnxy)$ bits to encode and time to assemble.

However, it is possible to do asymptotically better: $\Theta(mx+ny)+b$ space and time, which is $\Theta(mx+ny+xy)$ in the worst case. First a horizontal wire of length m(x+1) is created with splitters every x+1 units, and with a stem cell below every such splitter. This construction is possible, for example, using the spanning-tree method described previously: create a stem cell forwarding down, then finish a stem cell below, then forward right x times, repeat m times, then finish the horizontal line of stem cells into wires and splitters in the appropriate sequence. Next perform the same construction, but for a vertical wire of length n(y+1) with splitters and stem cells to their right every y+1 units. The result is an m×n array of stem cells, with a comb of splitters arranged to feed the same input to every stem cell. Finally the b-bit code for the desired component is provided, causing m×n copies of that component to be built in parallel.

Figure 8C:
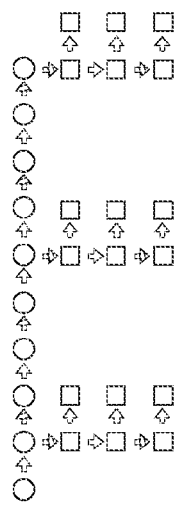
FIGS. 8A-C depict an example of building a 3×3 array of copies of a simple construction via parallel construction, according to one aspect of the present invention.
Figure 8B:
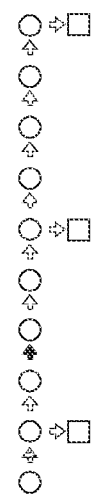
Figure 8A:
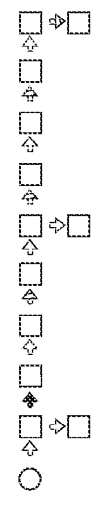

FIGS. 8A-C depict an example of building a 3×3 array of copies of a simple construction via parallel construction. FIG. 8A depicts the construct after construction of one stem cell per column, FIG. 8B depicts the construct after programming the wire and splitters to feed the columns, and FIG. 8C is after construction of one stem cell in each column in parallel.

Naturally, this construction generalizes to constructing an m×n×p grid of components in 3D. An improvement is made from the obvious $\Theta(mnpxyz)$ bound to $\Theta(mx+ny+pz)+b$, which is $\Theta(mx+ny+pz+xyz)$ in the worst case. As a final stage, it is possible to fill in the cracks between the components with arbitrary interconnection circuitry. The total area of these cracks in 2D is $\Theta(mx+ny)$, so any interconnection structure can be built in that much space and time. In 3D, the cracks are slabs of total volume $\Theta(mnxy+mpxz+npyz)$, so the obvious encoding may be rather large and slow. Instead, if the interconnection circuitry has a regular structure, the 2D grid construction can be applied to fill in the circuitry in $\Theta(mx+ny+pz)$ space and time.

Figure 9A:
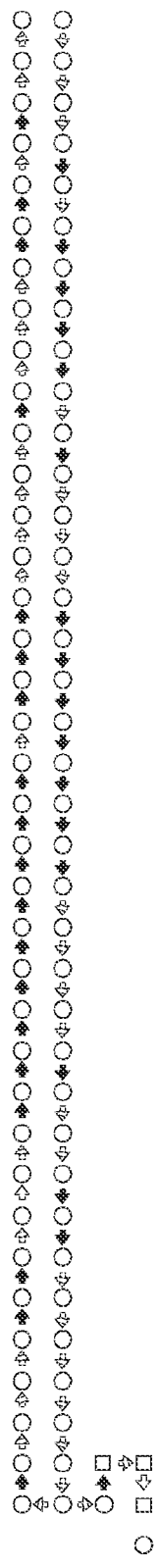
FIGS. 9A-B depict an example of constructing infinitely copies of a simple circuit via an infinite replicator, according to one aspect of the present invention.
Figure 9B:
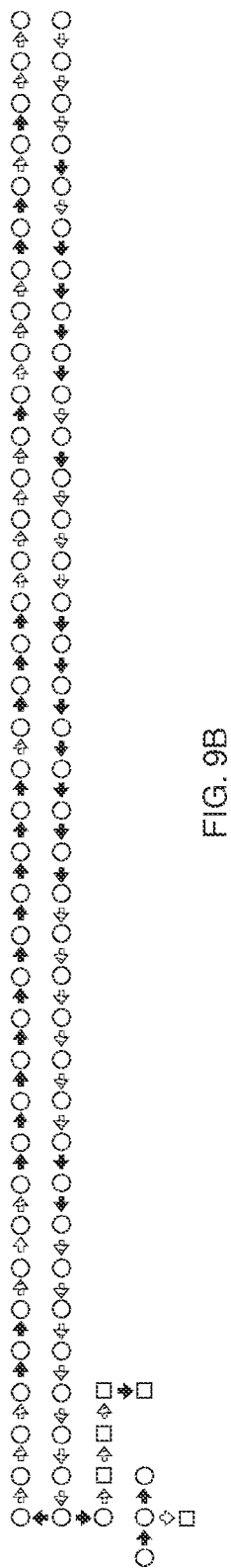

Infinite replicator. In another example, the idea is that any program to build an x×y circuit can be prefixed with an $O(x)$-bit string to make it instead produce infinitely many copies of that circuit arranged in a horizontal line. This idea is illustrated in FIGS. 9A-B after the prefix has been sent to the stem cell and produced its own constant-size driver circuit. FIGS. 9A-B depict an example of constructing infinitely copies of a simple circuit via an infinite replicator, according to one aspect of the present invention. FIG. 9A is an initial forwarding chain built by a replicator program and FIG. 9B shows completion of the first stem cell, wire chain.

This driver circuit is like a combination of two biological devices: polymerase (for duplication) and ribosome (for decoding code into circuitry). Specifically, it is a bitloop with a splitter, repeatedly feeding the same $O(x)$ bits, connected to a stem cell. Illustrated in FIGS. 9A-B is the case x=2, where just 81 bits are needed. These $O(x)$ bits encode a simple construction: forward right x times, forward down, forward left x times, forward down, finish a stem cell, finish a splitter with outputs right and down, finish a wire with output right x times, forward right. The bit loop causes these instructions to be repeated infinitely, which builds an infinite chain of splitters every x units along a wire, with a stem cell below each splitter. Thus the construction, over time, builds an infinite sequence of stem cells and feeds the original program to each of them, producing infinitely many copies of the desired circuit. More practically, a similar construction can be used to build n copies of a given circuit, using a binary counter to limit the number of repetitions of the bitloop. Again this construction can be represented by a prefix to a given b-bit string. The resulting construction uses $O(nx+b)$ time and $O(\lg n+x)+b$ space.

Another aspect is self-replication. In modern use, a quine is a program that outputs its own source code. The idea in a sequential computing system is as follows: first write a program Q which, given some program X as input, outputs a program Z which calls program X, giving it the code of program X as input. Then, call program Q, giving it the code of program Q as its arguments. In RALA, if a program is "quoted" then it is represented on the data wires; otherwise, it is configured into properly arranged cells. The output is performed by the stem cells, taking data from the data wires and configuring a proper arrangement of cells as specified. The "duplication" can be achieved by using two stem cells in parallel.

Figure 10:
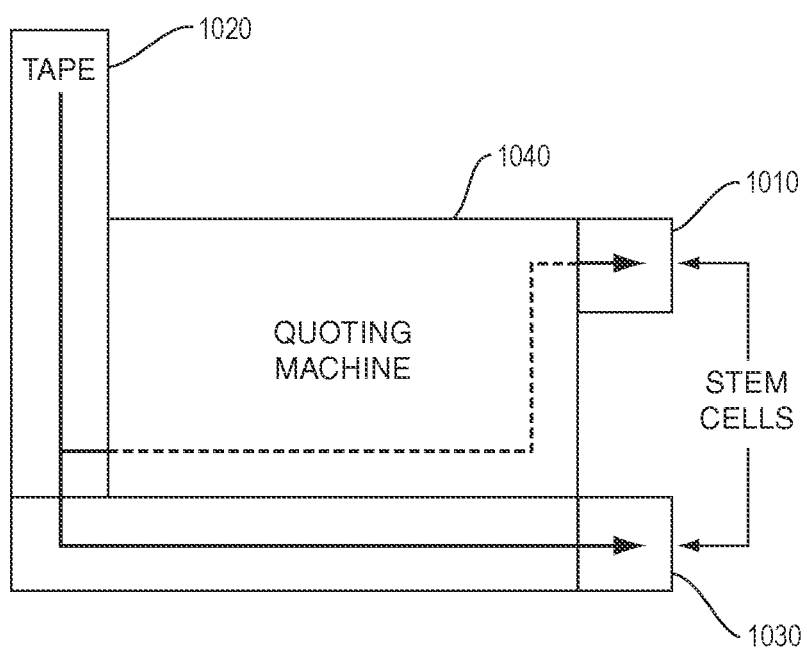
FIG. 10 is a high level diagram of an exemplary RALA quine, according to another aspect of the present invention.

FIG. 10 is a high level diagram of an exemplary RALA quine. In FIG. 10, upper stem cell 1010 creates a copy of tape 1020, and lower stem cell 1030 creates a copy of quoting machine 1040 (including two stem cells for the next generation). The tape contains all the data necessary to build the quoting machine, and the quoting machine contains an algorithm that can build a tape containing any given data. The substance of this quine therefore resides in the algorithm to convert a stream of data into a stream of folding codes that creates a tape pre-loaded with the same data. This depends on the specifics of the folding code being used.

Minimal RALA. A RALA-type model according to the present invention may be made simpler while maintaining the ability to systematically translate RALA circuits into it. For instance, the AND, OR, and XOR functions of a cell can be removed, and those functions simulated using NAND cells (replacing each original RALA cell by perhaps a 5×5 array of these simpler cells). This embodiment provides a new model for direct use that improves the efficiency of the average circuit by allocating computational resources with a finer granularity. Requiring a local simulation strategy simply ensures that the new model is still universal. An important consequence of a simpler RALA model is that it reduces the number of bits required to encode the state of a cell in the stem-cell program code.

Removing some of the logical functions is one way to simplify RALA; a more radical approach is to remove the explicit distinction between 0 tokens and 1 tokens, and represent this difference in software by the location of the token. Each "wire" carrying data is then replaced by two token channels, one for 0 tokens and the other for 1 tokens. The main challenge to this approach is that, if a 1 is sent, followed by a 0, there is no guarantee that the 0 will not get ahead of the 1 on the simulated wire. This challenge may be met, for example, by sending only one token at a time and employing a third token channel in the reverse direction for acknowledging receipt.

Other alternate embodiments include replacing explicit specification of input directions with another scheme for selective communication, or requiring that input directions be adjacent so that only one needs to be specified. The method to test these concepts is implementation of the same functions in each candidate model, and then to write down the stem-cell code for each one. The number of bits needed per cell goes down as the cells become simpler, but the number of cells needed to implement the same function could also go up. If the length of the folding code consistently decreases for various functions from RALA implementation to a different model, then that model maybe considered more efficient. It may also be desirable to find a model with the smallest stem-cell code per cell, even if the number of cells needed to implement practical functions increases by such a factor that the total stem-cell code becomes longer.

Algorithmic compression. Instead of changing the model, another way to minimize folding codes is to write the folding code for a machine that outputs the folding code to a stem cell, instead of just using the folding code itself. This has been demonstrated already for certain special cases such as unbounded lines and grids, but there is an interesting question of how best to compress an arbitrary circuit into a decompressing machine and (if necessary) a compact datastring. Given the similarity to Kolmogorov complexity, it seems possible that this problem is uncomputable, but there still may be interesting approximations or upper bounds.

System services. A different set of alternatives revolves around the necessary structures to support execution of multiple programs simultaneously, allocating them space, and then restricting their access to other programs. Such a collection of structures would be analogous to the operating system of a traditional computer. One possible consequence for the core model of such developments might be the necessity of a supervisor bit, like that in modern CPUs. Each cell would have the supervisor bit either set or cleared; a stem cell with the supervisor bit set can overwrite any existing cell and may set its supervisor bit, while a stem cell with the supervisor bit cleared may only overwrite other cells with the bit cleared and may not set the bit. The purpose of such a facility is for the "operating system" to keep the bit set, and to clear the bit wherever it loads programs. The operating system can then keep the program in a "cage" of cells with the supervisor bit set, and the program cannot expand beyond that cage. If the program needs to expand, it can make a system call using a wire back to the operating system, which can expand the cage.

High level programming. Individually specifying the function of each cell is analogous to individually writing a sequence of machine instructions for a traditional computer. Most computer programmers prefer to use a more abstract specification, and there is no reason that RALA should be any different. However, the types of abstraction that might be useful are likely to be different, because RALA instructions are placed in space rather than in time. One obvious type of tool would be to package RALA machines into "blocks" that can be created, deleted, and dragged about a display (similar to a visual dataflow language such as LabView). However, as with visual dataflow languages, it seems likely that such a tool would not easily scale to building large, complex systems: there is no facility for encapsulation, abstraction, iteration, etc. It may be advantageous to introduce such programming-language concepts into the visual tool provided by the present invention. Similarly, some form of textual language with spatial annotations may be useful. In some cases, it may alternatively be possible to do sufficient static analysis and layout that even the spatial annotations are unnecessary. Alternatively, the visual and textual languages could be merged into some hybrid language that captures both issues.

Figure 11:
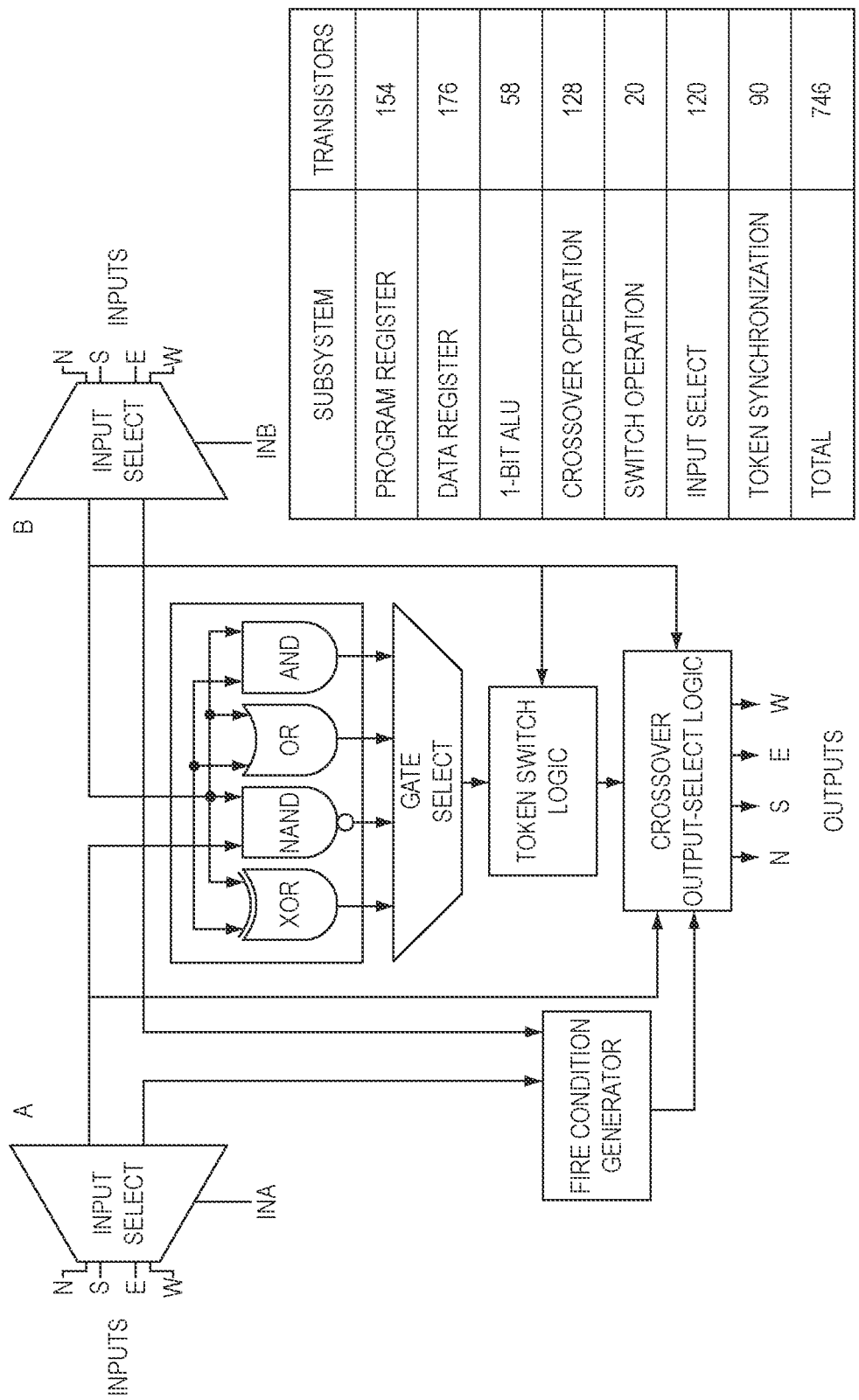
FIG. 11 is a schematic of an exemplary embodiment of ASIC architecture for a reconfigurable asynchronous logic automata cell.

Exemplary ASIC Implementation of RALA. FIG. 11 depicts an exemplary embodiment of ASIC architecture for a reconfigurable asynchronous logic automata cell. While a preferred embodiment is shown, it will be clear to one of skill in the art that many other configurations may be alternatively employed.

Figure 12:
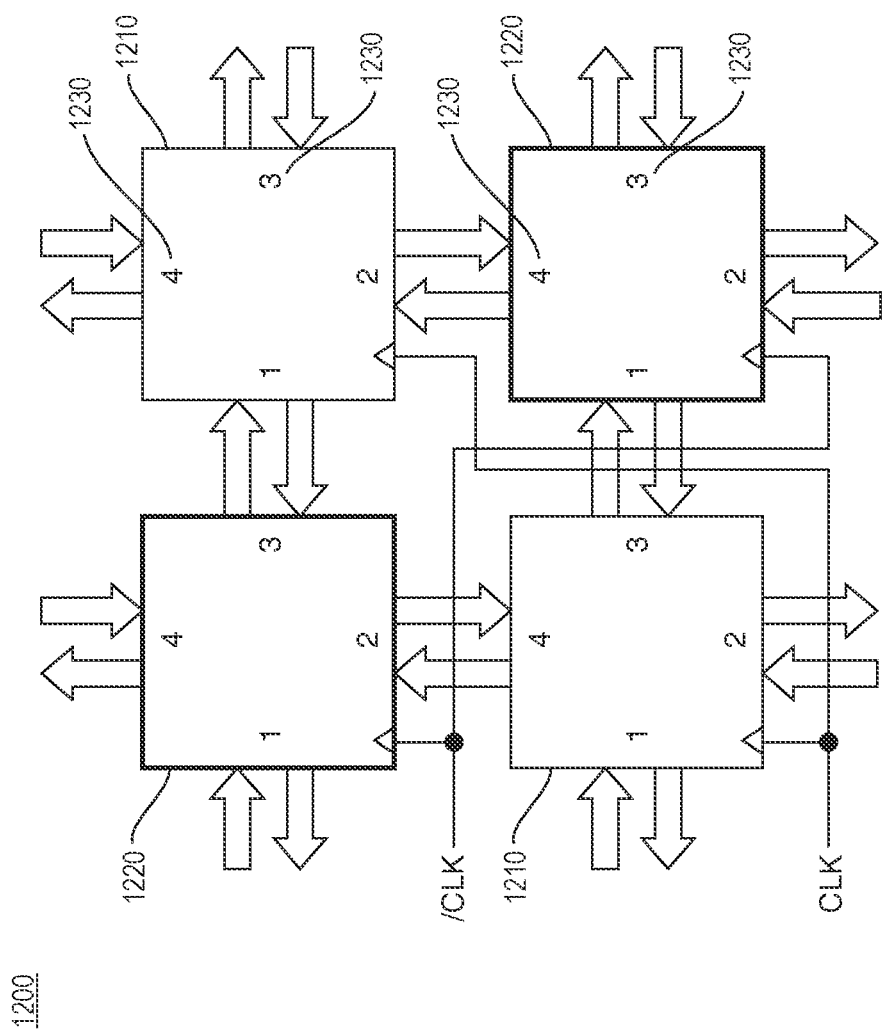
FIG. 12 is a schematic of an exemplary section of a single array of RALA cells.

A RALA chip consists of one of more arrays of RALA cells. A section of a single array of RALA cells is shown in FIG. 12. In FIG. 12, RALA chip 1200 contains an array of interconnected cells 1210, 1220. Each cell 1210, 1220 has four one-bit input/output ports 1230, each of which connect to its nearest neighbor cell only, in a square grid, as shown. Cells contain combinational logic and flip-flops. Cells 1210 are clocked on the positive edge of the clock, and cells 1220 are clocked on a negative edge. Since cells only connect to their north/south/east/west neighbors, this allows cells to use the combinational logic outputs of their connected neighbors in their own combinational logic without problems with invalid outputs or metastability.

Each RALA cell array is a double-edge-clocked synchronous finite state machine, whose operation is described in detail in conjunction with the descriptions of FIGS. 13-18. A RALA array process tokens input around its perimeter, and outputs tokens around its perimeter. At its perimeter, a RALA array may be connected to another RALA array or to external communications interfaces (e.g. Ethernet), other computers, human-interface, or data-storage devices.

Figure 13:
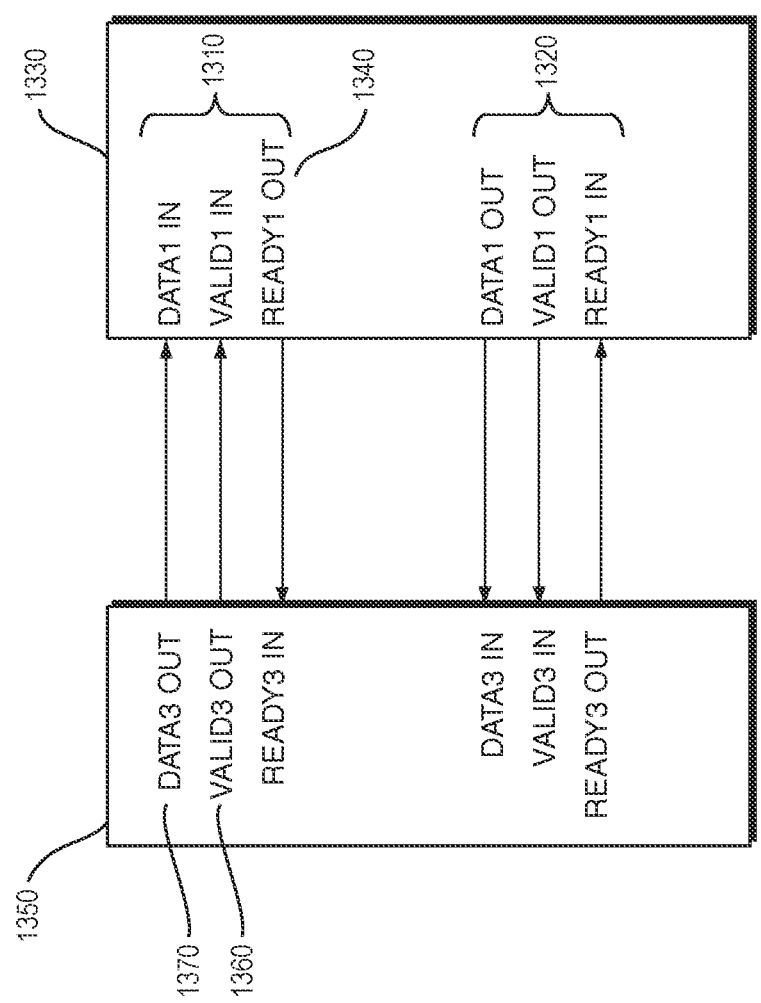
FIG. 13 is a detail view of a RALA array, showing the signal interaction and interconnection of two cells on one edge.

FIG. 13 is a detail view of the array of FIG. 12, showing the signal interaction and interconnection of two cells on one edge. The signals associated with sending tokens from left to right are shown in upper group 1310 of signals, and the signals associated with sending tokens from right to left are shown in the lower group 1320 of signals. For upper group 1310, if right cell 1330 is ready to accept a token on the next clock, it sets the READY signal 1340 high. To send a token, left cell 1350 sets the VALID signal 1360 high and sets the DATA signal 1370 to the 1-bit data value for the token. Note that it is completely valid for READY signal 1340 to be high again on the very next clock; this indicates either that right cell 1330 is not listening to tokens on this input, or that the token was received and processed in one clock; in any event, cell 1330 is again ready for a new token. Lower signal group 1320 functions identically, but with left and right reversed.

Figure 14:
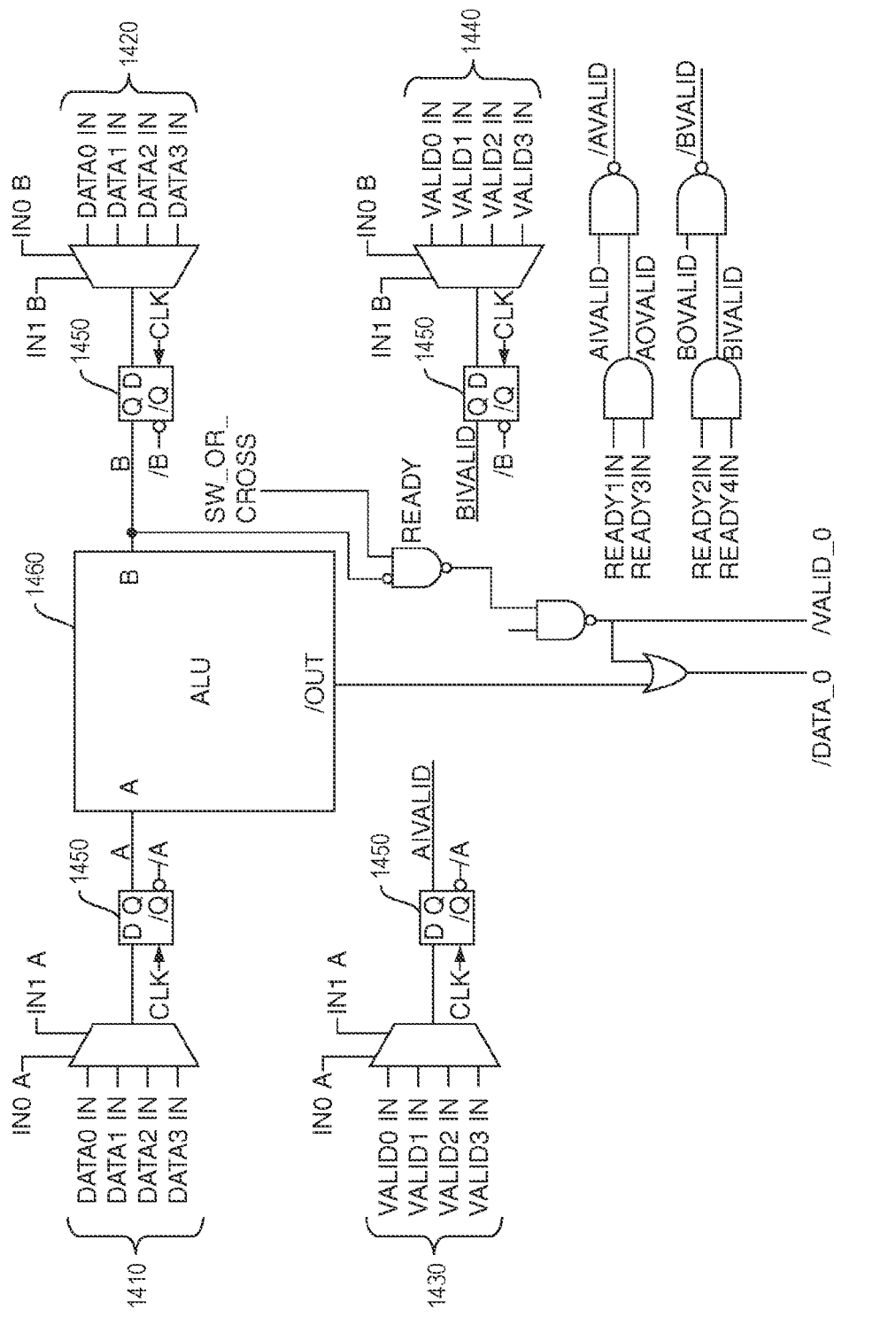
FIG. 14 is a schematic of an exemplary ASIC embodiment of the input unit of a RALA cell.

FIG. 14 is a schematic of an exemplary ASIC embodiment of the input unit of a RALA cell. From the four (north/south/east/west) inputs 1410, 1420, 1430, 1440 to the cell, two are selected based on the configuration word. The data from each input 1410, 1420, 1430, 1440 is buffered in a D-flip flop 1450 and passed to arithmetic and logic unit (ALU) 1460.

Figure 15:
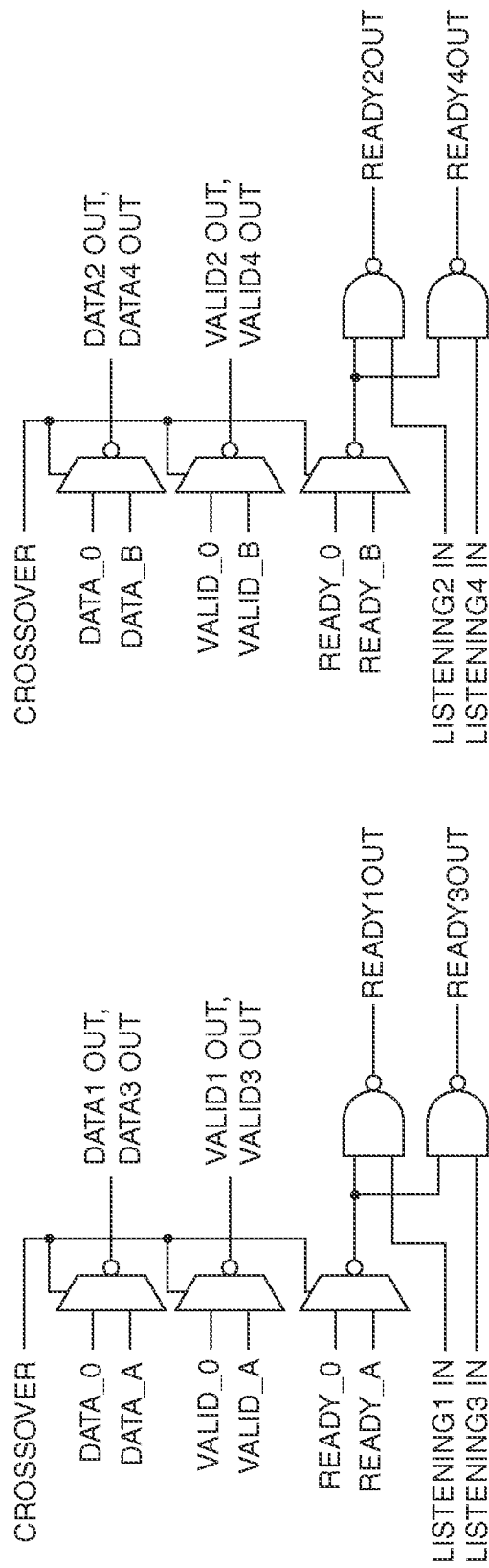
FIG. 15 is a schematic of an exemplary ASIC embodiment of the crossover and output unit of a RALA cell.

FIG. 15 is a schematic of an exemplary ASIC embodiment of the crossover and output unit of a RALA cell. If the crossover gate is not selected, the DATA_O, VALID_O, and READY_O signals are routed to all outputs. If the crossover gate is selected, the DATA_A, VALID_A, and READY_A signals are routed to outputs 1 and 3 and the DATA_B, VALID_B, and READY_B signals are routed to outputs 2 and 4. The READY OUT signal for each output is forced active-high if the cell is not listing to the corresponding input.

Figure 16:
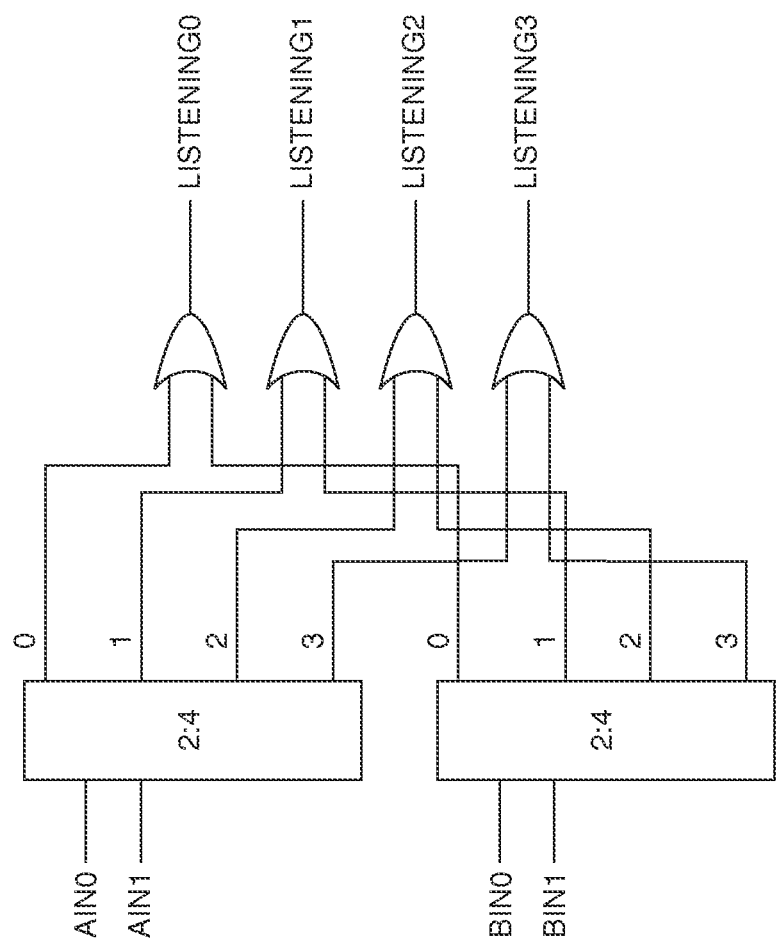
FIG. 16 is a schematic of an exemplary ASIC embodiment of the Listening Output unit of a RALA cell.
Figure 17:
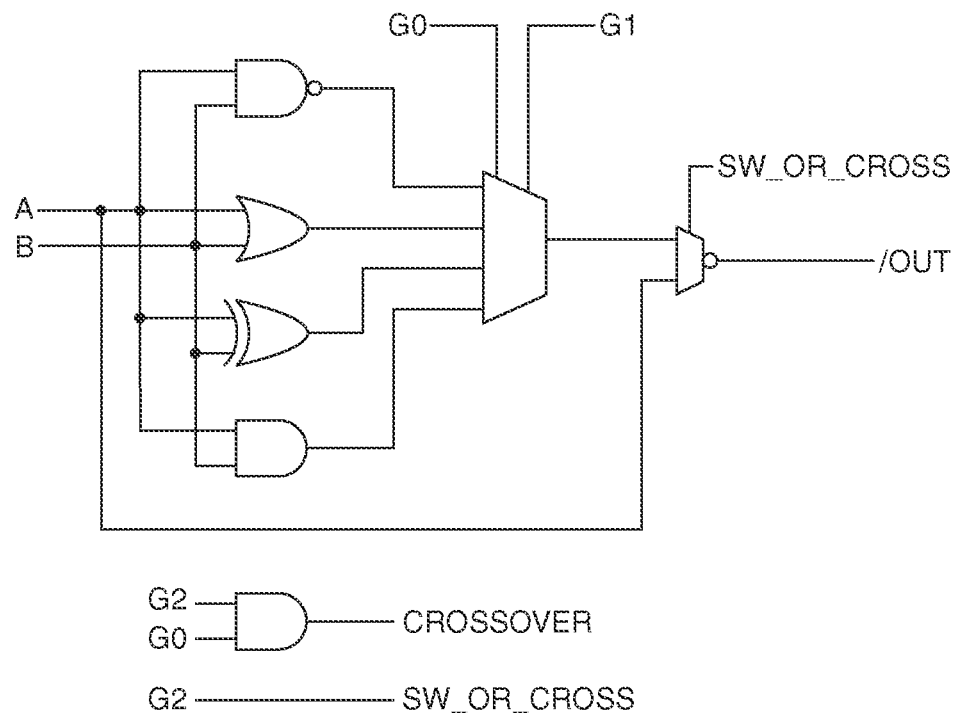
FIG. 17 is a schematic of an exemplary ASIC embodiment of the Arithmatic and Logic Unit (ALU) for a RALA cell.

FIG. 16 is a schematic of an exemplary ASIC embodiment of the Listening Output unit of a RALA cell. This circuit generates the active-high LISTENING for an input if it is used in the computation. FIG. 17 is a schematic of an exemplary ASIC embodiment of the Arithmatic and Logic Unit (ALU) for a RALA cell. The ALU computes the required function (NAND, OR, XOR, or AND) required of the cell. If the SW_OR_CROSS signal is active, indicating a switch or crossover operation rather than a gate operation is selected, the ALU routes input A to the output.

Figure 18:
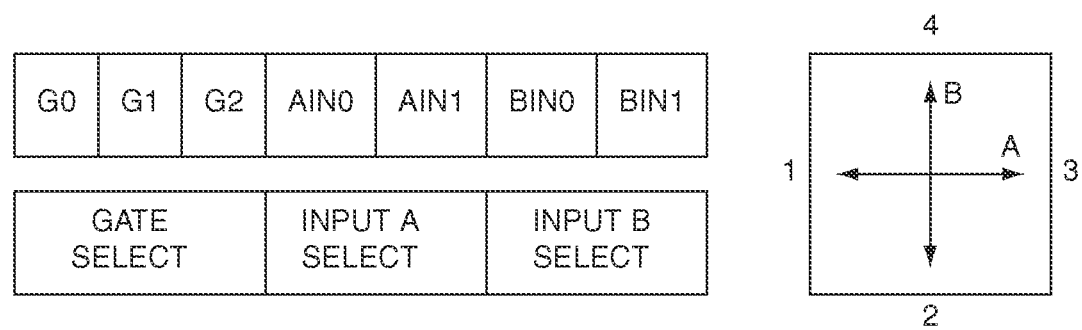
FIG. 18 depicts an exemplary embodiment of the configuration word for each RALA cell, as stored in an internal register.

FIG. 18 depicts an exemplary embodiment of the configuration word for each RALA cell, as stored in an internal register. G0-G3 select the gate active (AND, OR, NAND, XOR, copy, delete, crossover, or stem) from one of the eight possible gates for each cell. AIN0-AIN1 select one of the four inputs for the channel A input for the gate, and BIN0BIN1 select one of the four inputs for the channel B input to the gate. A wire or fan-out element is selected by using a one-input AND or OR gate with both inputs set to the same channel. If the crossover is selected, the A input must be input 1 or 3, and the B input must be input 2 or 4, so that the simple crossover circuitry shown above will work correctly.

Connection of multiple arrays on a chip or in a system to form a larger, virtual RALA array. Multiple, asynchronously clocked RALA arrays can be connected together, on the same chip, on different chips, or a combination of these, to allow the construction of a indefinitely large virtual RALA array without concern for speed-of-light delays in signal routing, since all interconnections are nearest neighbor and asynchronous token-passing is allowed.

At the perimeter of each RALA array state machine, a communications processing unit is typically required to buffer tokens and transfer them between clock domains. One such communications processing unit could have a 2-token-deep FIFO buffer for tokens at each communications port, and transmit the tokens between clock domains using the well known four-phase-commit asynchronous token-passing protocol.

One of skill in the art of the invention will see that, with this architecture, it is possible to construct an indefinitely large computational fabric out of a set of nearest-neighbor connected RALA arrays that appears to be one large asynchronous RALA, but without the transistor-count overhead typically associated with asynchronous circuits, since most interconnections are made inside the synchronous clock domain, and only a small number are made between them. Because RALA create spatial structures, if the cells are actuated this provides a programming model for programmable matter that can simultaneously describe an object's shape, logic, and communications. In an exemplary embodiment, the attraction of cells is done by hydrodynamic forces, and the latching by electro-permanent magnets. Physically reconfigurable asynchronous logic automata have applications in three-dimensional rapid prototyping of functional systems, reconfigurable robotics, and inventory and supply chain management.

Figure 19:
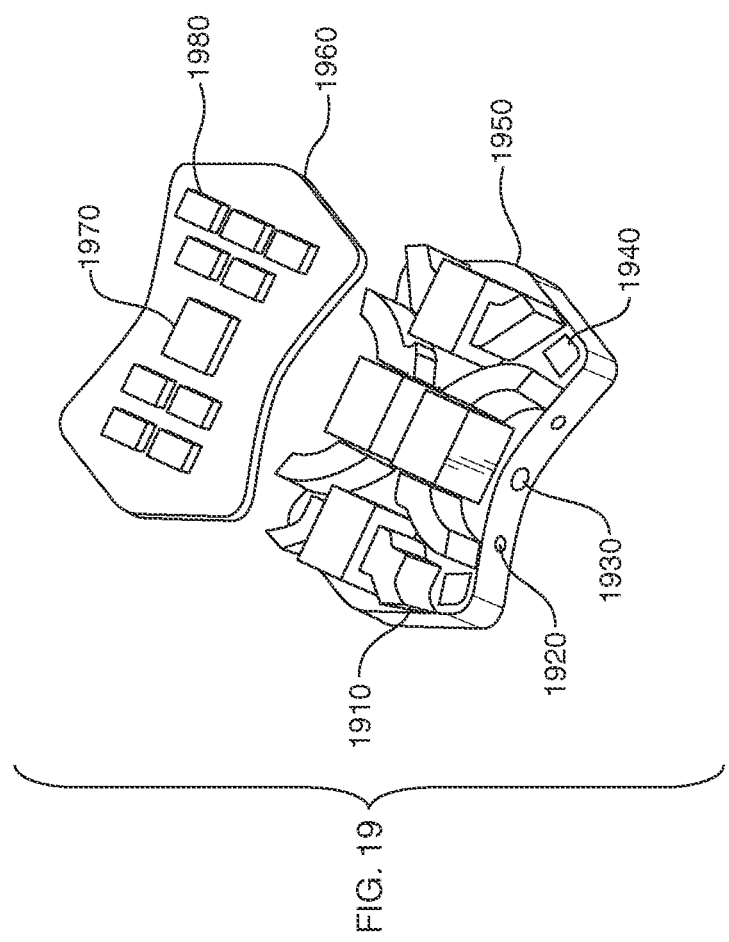
FIG. 19 depicts an implementation of an exemplary physically-reconfigurable ALA cell.

FIG. 19 depicts an implementation of an exemplary physically-reconfigurable ALA cell. The cells tile in a rectangular array to form an ALA. Each cell is responsible for a rectangular region of the computation, which could be as small as one cell, or could be millions of cells. Cells include electrical contacts for transferring power to neighboring cells, a latching mechanism to attach to neighboring cells, a mechanism to communicate to neighboring cells, and reconfigurable ALA logic. In the embodiment shown in FIG. 19, electropermanent magnets 1910 are used for the latches, spring-pins 1920 for the contacts, and infrared transceivers to communicate or to detect the presence of neighboring cells. Alternative options for the latch include, but are not limited to, electrostatic (capacitor) pads or mechanical solenoid or motor-operated latches. Alternative options for the communications include, but are not limited to, near-field electrostatic, radio, or electrical contacts. Alternative options for sensing a nearby cell include, but are not limited to, electrostatic or inductive proximity sensors. Also shown in FIG. 19 are fluid port 1930, flexure magnet mount 1940, 3D-printed acrylic base 1950, printed circuit board (PCB) 1960, MCU 1970, and Dual Power MOSFET 1980.

In a preferred embodiment, reconfigurable ALA cells are used in a fluid bath. The fluid bath has one or more ports with the same interfaces as a cell, providing communications and supplying power. RALA cells are poured into the fluid bath by the operator, and then circulated by jets in the bath.

When the user desires to begin a computation, they send a program through one of the ports. When the port detects one of the cells swirling in the bath has come within range of the port, it draws it in with the electropermanant magnet or electrostatic capacitor pads. Geometric features in the design of the cell align it with the port. Once the contacts line up, the cell is powered, and loaded with the user's data. From then, the process of ALA circuit construction continues as in the virtual versions, with the program streaming in over the communications port in the matrix of cells, initially configured as stem cells. If the program reaches an edge, where there are no more cells, that that edge waits until a cell comes within range, draws it in, and the process continues. In this way, the computer self-reconfigures its shape to fit the shape of the user's computation. If the computation is too large for the number of cells in the bath, the user can pour more RALA cells into the bath.

Digital Fabrication Applications. This same system can also be used as a fabrication tool, in similar fashion to a three-dimensional printer. The user loads the program for the desired object, and by the process of the program growing itself, the object—made from RALA cells—is fabricated. (For example, the object could be a wrench, or a drink mug, or a picture frame.) Unlike with a three-dimensional printer, when the user is done with the object, they can put it back into the bath and attach it to one of the power ports, and they can program it to disassemble itself, so the RALA cells can be used to build new objects. Also, since the object is made of RALA cells, it can have a computational function; for example, it could be used as a digital music player or a cellular telephone.

Fluid Valves. In one embodiment, fluidic flow fields are employed to increase the speed with which system can grow a computation or object. In this embodiment, there is a pump attached to each port providing a fluid flow source. The cells have fluid connections as well as electrical connections on their faces, and each cell contains a valve for each face. All fluid ports connect to each other, switched through one valve per face. When a cell is latched the valve on that face is open, effectively making the network of RALA cells a porous channel for flow. When a cell needs to draw in a cell, it opens its valve, biasing the flow toward that cell. This will tend to draw cells floating in the bath toward areas needing cells. A preferred fluid is 3M Flourinert electronic liquid, because it is electrically insulating, dense, and low viscosity. However, air, water, silicone oil, or a variety of other fluids could be alternatively used.

It will be clear to one of skill in the art that there are many possible Reconfigurable Asynchronous Logic Automata variations, including, but not limited to: (1) No Diagonals, wherein connections may only be present between vertically or horizontally adjacent cells, in order to simplify circuit layout; (2) Multiple signals, wherein more than four token-storing edges may connect neighboring cells, allowing the conveyance of more parallel information in the same period of time; and (3) More functions, wherein the class of possible functions executed by each cell need not be limited to {AND, OR, XOR, NAND}, but may include any function f: $\{0, 1, \emptyset\}^n \rightarrow \{0, 1, \emptyset\}^n$, where n is the number of neighbors of each cell (for n=8, there are 43,046,721 possible functions). A cell executing function f may fire if f's present output is not $\emptyset^n$ and every non-empty element of the output points to either an inactive or empty set of output edges. Then each of those output edges would become populated with the value specified by f's output. There is a tradeoff between the number of functions allowed and the number of configuration bits in each cell needed to specify the function.

While a preferred embodiment is disclosed, many other implementations will occur to one of ordinary skill in the art and are all within the scope of the invention. Each of the various embodiments described above may be combined with other described embodiments in order to provide multiple features. Furthermore, while the foregoing describes a number of separate embodiments of the apparatus and method of the present invention, what has been described herein is merely illustrative of the application of the principles of the present invention. Other arrangements, methods, modifications, and substitutions by one of ordinary skill in the art are therefore also considered to be within the scope of the present invention, which is not to be limited except by the claims that follow.

What is claimed is:

1. A reconfigurable logic cell, comprising:
   a plurality of one-bit buffers, each buffer configurable for asynchronous communication with a neighboring logic cell, each buffer capable of having a plurality of buffer states, wherein each buffer state is selected from the group consisting of logical one, logical zero, and empty, wherein the logical one and logical zero states occur when the buffer contains a data bit and the empty state occurs when the buffer does not contain a data bit, and wherein each buffer is functionally configured for receiving an input state token from the neighboring logic cell or for transferring an output state token to the neighboring logic cell; and
   a one-bit processor, the processor being configurable to perform a logic operation, utilizing at least one input state token received from at least one of the buffers as at least one input for the logic operation, and to produce an output state token reflecting the result of the logic operation, wherein the processor is configured to trigger performance of the logic operation whenever all buffers configured to receive input tokens are not in the empty state and all buffers configured to transfer output tokens are in the empty state, and wherein the logic operation performed by the processor and the functional configuration of the buffers is reconfigurably programmable.

2. The logic cell of claim 1, wherein the processor is further configured to store a logic cell current state.

3. The logic cell of claim 1, wherein the processor is responsive to programming instructions received by the logic cell and responds to received programming instructions by at least one of the steps of: changing the logic operation performed by the computational circuitry and changing the functionality of at least one buffer.

4. The logic cell of claim 3, wherein the programming instructions to which the processor responds are combinations of one or more state tokens received by the buffers.

5. The logic cell of claim 1, wherein the processor is responsive to programming instructions received by the logic cell and responds to received programming instructions by communicating programming instructions to at least one neighboring logic cell.

6. The logic cell of claim 5, wherein the processor interprets the received programming instructions in order to determine to which neighboring logic cell they should be communicated.

7. The logic cell of claim 1, wherein cell further comprises at least one register in which output tokens are stored until buffers configured to transfer output tokens are in the empty state.

8. A reconfigurable logic circuit, comprising:
 a plurality of reconfigurable logic cells, each cell comprising:
  a plurality of one-bit buffers, each buffer configurable for asynchronous communication with a neighboring logic cell, each buffer capable of having a plurality of buffer states, wherein each buffer state is selected from the group consisting of logical one, logical zero, and empty, wherein the logical one and logical zero states occur when the buffer contains a data bit and the empty state occurs when the buffer does not contain a data bit, and wherein each buffer is functionally configured for receiving an input state token from the neighboring logic cell or for transferring an output state token to the neighboring logic cell; and
  a one-bit processor, the processor being configurable to perform a logic operation, utilizing at least one input state token received from at least one of the buffers as at least one input for the logic operation, and to produce an output state token reflecting the result of the logic operation, wherein the processor is configured to trigger performance of the logic operation whenever all buffers configured to receive input tokens are not in the empty state and all buffers configured to transfer output tokens are in the empty state, and wherein the logic operation performed by the processor and the functional configuration of the buffers is reconfigurably programmable.

9. The circuit of claim 8, wherein the circuit is reconfigurable by locally passing combinations of state tokens in order to program individual ones of the logic cells comprising the circuit.

10. The circuit of claim 8, wherein token sequences representing programming instructions are shifted through contiguous neighboring logic cells until the instructions reach a destination logic cell that is to be configured by the instructions.

11. A method for constructing a logic circuit, comprising the steps of:
 providing a plurality of contiguous logic cells, each logic cell comprising:
  a plurality of one-bit buffers, each buffer configurable for asynchronous communication with a neighboring logic cell, each buffer capable of having a plurality of buffer states, wherein each buffer state is selected from the group consisting of logical one, logical zero, and empty, wherein the logical one and logical zero states occur when the buffer contains a data bit and the empty state occurs when the buffer does not contain a data bit, and wherein each buffer is functionally configured for receiving an input state token from the neighboring logic cell or for transferring an output state token to the neighboring logic cell; and
  a one-bit processor, the processor being configurable to perform a logic operation, utilizing at least one input state token received from at least one of the buffers as at least one input for the logic operation, and to produce an output state token reflecting the result of the logic operation, wherein the processor is configured to trigger performance of the logic operation whenever all buffers configured to receive input tokens are not in the empty state and all buffers configured to transfer output tokens are in the empty state, and wherein the logic operation performed by the processor and the functional configuration of the buffers is reconfigurably programmable;
 programmably configuring at least some contiguous logic cells into a forwarding chain for forwarding received programming instructions to neighboring logic cells; and
 forwarding programming instructions along the forwarding chain to programmably configure each of the plurality of logic cells, constructing the logic circuit.

12. A method for performing a logic operation, comprising the steps of:
 providing a plurality of contiguous logic cells, wherein each logic cell has at least one input buffer and at least one output buffer and performs the steps of:
  receiving an input state token from a neighboring logic cell into each of the input buffers, wherein each buffer is capable of having a plurality of buffer states selected from the group consisting of logical one, logical zero, and empty, wherein the logical one and logical zero states occur when the buffer contains a state token and the empty state occurs when the buffer does not contain a state token;
  when an input state token is present in each input buffer and each output buffer is in the empty state, performing a logic operation in a one-bit processor utilizing the input state token as at least one input for the logic operation, producing an output state token reflecting the result of the logic operation, wherein the processor is configured to trigger performance of the logic operation whenever all buffers configured to receive input tokens are not in the empty state and all buffers configured to transfer output tokens are in the empty state; and
  transferring the output state token to at least one neighboring logic cell via at least one output buffer, wherein the logic operation performed by the processor and the functional configuration of the buffers is reconfigurably programmable.

* * * * *